(12) United States Patent
Moro et al.

(10) Patent No.: US 7,767,498 B2
(45) Date of Patent: Aug. 3, 2010

(54) ENCAPSULATED DEVICES AND METHOD OF MAKING

(75) Inventors: Lorenza Moro, San Carlos, CA (US); Todd L. Krajewski, Mountainview, CA (US)

(73) Assignee: Vitex Systems, Inc., San Jose, CA (US)

( * ) Notice: Subject to any disclaimer, the term of this patent is extended or adjusted under 35 U.S.C. 154(b) by 739 days.

(21) Appl. No.: 11/509,837

(22) Filed: Aug. 24, 2006

(65) Prior Publication Data

US 2007/0049155 A1 Mar. 1, 2007

Related U.S. Application Data

(60) Provisional application No. 60/711,136, filed on Aug. 25, 2005.

(51) Int. Cl.
*H01L 21/00* (2006.01)
(52) U.S. Cl. ...................................... 438/126
(58) Field of Classification Search ........................ None
See application file for complete search history.

(56) References Cited

U.S. PATENT DOCUMENTS

| | | | |
|---|---|---|---|
| 2,382,432 A | 8/1945 | McManus et al. |
| 2,384,500 A | 9/1945 | Stoll |
| 3,475,307 A | 10/1969 | Knox et al. |
| 3,496,427 A | 2/1970 | Lee |
| 3,607,365 A | 9/1971 | Lindlof |
| 3,661,117 A | 5/1972 | Cornelius et al. |
| 3,941,630 A | 3/1976 | Larrabee |
| 4,061,835 A | 12/1977 | Poppe et al. |
| 4,098,965 A | 7/1978 | Kinsman |
| 4,266,223 A | 5/1981 | Frame |
| 4,283,482 A | 8/1981 | Hattori et al. |

(Continued)

FOREIGN PATENT DOCUMENTS

BE 704297 2/1968

(Continued)

OTHER PUBLICATIONS

Clark I. Bright, et al., Transparent Barrier Coatings Based on ITO for Flexible Plastic Displays, Oct. 17-19, 1999, pp. 247-264, Tucson, Arizona.

(Continued)

*Primary Examiner*—David E Graybill
(74) *Attorney, Agent, or Firm*—Dinsmore & Shohl LLP

(57) ABSTRACT

A method of encapsulating an environmentally sensitive device. The method includes providing a substrate; placing at least one environmentally sensitive device adjacent to the substrate; and depositing at least one barrier stack adjacent to the environmentally sensitive device, the at least one barrier stack comprising at least one barrier layer and at least one polymeric decoupling layer, wherein the at least one polymeric decoupling layer is made from at least one polymer precursor, and wherein the polymeric decoupling layer has at least one of: a reduced number of polar regions; a high packing density; a reduced number of regions that have bond energies weaker than a C—C covalent bond; a reduced number of ester moieties; increased Mw of the at least one polymer precursor; increased chain length of the at least one polymer precursor; or reduced conversion of C=C bonds. An encapsulated environmentally sensitive device is also described.

18 Claims, 16 Drawing Sheets

U.S. PATENT DOCUMENTS

| | | |
|---|---|---|
| 4,313,254 A | 2/1982 | Feldman et al. |
| 4,426,275 A | 1/1984 | Meckel et al. |
| 4,521,458 A | 6/1985 | Nelson |
| 4,537,814 A | 8/1985 | Itoh et al. |
| 4,555,274 A | 11/1985 | Kitajima et al. |
| 4,557,978 A | 12/1985 | Mason |
| 4,572,845 A | 1/1986 | Dietrich et al. |
| 4,581,337 A | 4/1986 | Frey et al. |
| 4,624,867 A | 11/1986 | Iijima et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wofe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,344,501 A * | 9/1994 | Hashimoto et al. .......... 136/259 |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Abe et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,578,141 A | 11/1996 | Mori et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Tropsha |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,138 A | 10/1998 | Yamazaki et al. |
| 5,821,692 A | 10/1998 | Rogers et al. |
| 5,844,363 A | 12/1998 | Gu et al. |
| 5,861,658 A | 1/1999 | Cronin et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,004,660 A | 12/1999 | Topolski et al. |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |
| 6,084,702 A | 7/2000 | Byker et al. |
| 6,087,007 A | 7/2000 | Fuji et al. |
| 6,092,269 A | 7/2000 | Yializis et al. |
| 6,106,627 A | 8/2000 | Yializis et al. |
| 6,117,266 A | 9/2000 | Horzel et al. |
| 6,118,218 A | 9/2000 | Yializis et al. |
| 6,137,221 A | 10/2000 | Roitman et al. |
| 6,146,225 A | 11/2000 | Sheates et al. |
| 6,146,462 A | 11/2000 | Yializis et al. |
| 6,150,187 A | 11/2000 | Zyung et al. |
| 6,165,566 A | 12/2000 | Tropsha |
| 6,178,082 B1 | 1/2001 | Farooq et al. |
| 6,195,142 B1 | 2/2001 | Gyotoku et al. |
| 6,198,217 B1 | 3/2001 | Suzuki et al. |
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |
| 6,350,034 B1 | 2/2002 | Fleming et al. |
| 6,352,777 B1 | 3/2002 | Bulovic et al. |

| | | |
|---|---|---|
| 6,358,570 B1 | 3/2002 | Affinito |
| 6,361,885 B1 | 3/2002 | Chou |
| 6,387,732 B1 | 5/2002 | Akram |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,460,369 B2 | 10/2002 | Hosokawa |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,548,912 B1 | 4/2003 | Graff et al. |
| 6,569,515 B2 | 5/2003 | Hebrink et al. |
| 6,570,325 B2 | 5/2003 | Graff et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,660,409 B1 | 12/2003 | Komatsu et al. |
| 6,664,137 B2 | 12/2003 | Weaver |
| 6,681,716 B2 | 1/2004 | Schaepkens |
| 6,720,203 B2 | 4/2004 | Carcia et al. |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,827,788 B2 | 12/2004 | Takahashi |
| 6,835,950 B2 | 12/2004 | Brown et al. |
| 6,836,070 B2 | 12/2004 | Chung et al. |
| 6,837,950 B1 | 1/2005 | Berard |
| 6,852,356 B2 | 2/2005 | Nishikawa |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,911,667 B2 | 6/2005 | Pichler et al. |
| 6,923,702 B2 | 8/2005 | Graff et al. |
| 6,936,131 B2 | 8/2005 | McCormick et al. |
| 6,975,067 B2 | 12/2005 | McCormick et al. |
| 6,994,933 B1 | 2/2006 | Bates |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,033,850 B2 | 4/2006 | Tyan et al. |
| 7,056,584 B2 | 6/2006 | Iacovangelo |
| 7,086,918 B2 | 8/2006 | Hsiao et al. |
| 7,112,351 B2 | 9/2006 | Affinito |
| 7,122,418 B2 | 10/2006 | Su et al. |
| 7,156,942 B2 | 1/2007 | McCormick et al. |
| 7,166,007 B2 | 1/2007 | Auch et al. |
| 7,183,197 B2 | 2/2007 | Won et al. |
| 7,186,465 B2 | 3/2007 | Bright |
| 7,198,832 B2 | 4/2007 | Burrows et al. |
| 7,221,093 B2 | 5/2007 | Auch et al. |
| 7,255,823 B1 | 8/2007 | Guenther et al. |
| 7,621,794 B2 | 11/2009 | Lee et al. |
| 2001/0015074 A1 | 8/2001 | Hosokawa |
| 2001/0015620 A1 | 8/2001 | Affinito |
| 2001/0044035 A1 | 11/2001 | Morii |
| 2002/0015818 A1 | 2/2002 | Takahashi et al. |
| 2002/0022156 A1 | 2/2002 | Bright |
| 2002/0025444 A1 | 2/2002 | Hebrink et al. |
| 2002/0068143 A1 | 6/2002 | Silvernail et al. |
| 2002/0069826 A1 | 6/2002 | Hunt et al. |
| 2002/0091174 A1* | 7/2002 | Soane et al. ............... 523/106 |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0045021 A1 | 3/2003 | Akai |
| 2003/0085652 A1 | 5/2003 | Weaver |
| 2003/0098647 A1 | 5/2003 | Silvernail et al. |
| 2003/0117068 A1 | 6/2003 | Forrest et al. |
| 2003/0124392 A1 | 7/2003 | Bright |
| 2003/0127973 A1 | 7/2003 | Weaver et al. |
| 2003/0134487 A1 | 7/2003 | Breen et al. |
| 2003/0184222 A1 | 10/2003 | Nilsson et al. |
| 2003/0197197 A1 | 10/2003 | Brown et al. |
| 2003/0199745 A1* | 10/2003 | Burson et al. ............... 600/347 |
| 2003/0205845 A1 | 11/2003 | Pichler et al. |
| 2003/0218422 A1 | 11/2003 | Park et al. |
| 2003/0235648 A1 | 12/2003 | Affinito et al. |
| 2004/0002729 A1* | 1/2004 | Zamore ....................... 606/194 |
| 2004/0018305 A1 | 1/2004 | Pagano et al. |
| 2004/0029334 A1 | 2/2004 | Bijker et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0115603 A1 | 6/2005 | Yoshida et al. |

| | | | | | | |
|---|---|---|---|---|---|---|
| 2005/0122039 A1 | 6/2005 | Satani | | JP | 06158305 | 11/1992 |
| 2005/0129841 A1 | 6/2005 | McCormick et al. | | JP | 05-217158 | 1/1993 |
| 2005/0133781 A1 | 6/2005 | Yan et al. | | JP | 5501587 | 3/1993 |
| 2005/0140291 A1 | 6/2005 | Hirakata et al. | | JP | 5-147678 | 6/1993 |
| 2005/0146267 A1 | 7/2005 | Lee et al. | | JP | 05182759 | 7/1993 |
| 2005/0174045 A1 | 8/2005 | Lee et al. | | JP | 5290972 | 11/1993 |
| 2005/0176181 A1 | 8/2005 | Burrows et al. | | JP | 06-136159 | 5/1994 |
| 2005/0202646 A1 | 9/2005 | Burrows et al. | | JP | 61-79644 | 6/1994 |
| 2005/0212419 A1 | 9/2005 | Vazan et al. | | JP | 6234186 A | 8/1994 |
| 2005/0224935 A1 | 10/2005 | Schaepkens et al. | | JP | 07-074378 | 3/1995 |
| 2005/0238846 A1 | 10/2005 | Arakatsu et al. | | JP | 07147189 | 6/1995 |
| 2005/0239294 A1 | 10/2005 | Rosenblum et al. | | JP | 07192866 | 7/1995 |
| 2006/0001040 A1 | 1/2006 | Kim et al. | | JP | 8-72188 | 3/1996 |
| 2006/0003474 A1 | 1/2006 | Tyan et al. | | JP | 08171988 | 7/1996 |
| 2006/0028128 A1 | 2/2006 | Ohkubo | | JP | 08179292 | 7/1996 |
| 2006/0061272 A1 | 3/2006 | McCormick et al. | | JP | 08325713 | 10/1996 |
| 2006/0062937 A1 | 3/2006 | Padiyath et al. | | JP | 8-318590 | 12/1996 |
| 2006/0063015 A1 | 3/2006 | McCormick et al. | | JP | 09059763 | 4/1997 |
| 2006/0132461 A1 | 6/2006 | Furukawa et al. | | JP | 09132774 | 5/1997 |
| 2006/0216951 A1 | 9/2006 | Moro et al. | | JP | 9-161967 | 6/1997 |
| 2006/0246811 A1 | 11/2006 | Winters et al. | | JP | 09161967 | 6/1997 |
| 2006/0250084 A1 | 11/2006 | Cok et al. | | JP | 9-201897 | 8/1997 |
| 2006/0291034 A1 | 12/2006 | Patry et al. | | JP | 09-232553 | 9/1997 |
| 2007/0009674 A1 | 1/2007 | Okubo et al. | | JP | 10-725 | 1/1998 |
| 2007/0049155 A1* | 3/2007 | Moro et al. ............ 445/24 | | JP | 10-013083 | 1/1998 |
| 2007/0187759 A1 | 8/2007 | Lee et al. | | JP | 10-016150 | 1/1998 |
| 2007/0281089 A1 | 12/2007 | Heller et al. | | JP | 10312883 | 11/1998 |
| 2008/0032076 A1 | 2/2008 | Dujardin et al. | | JP | 10-334744 | 12/1998 |
| 2009/0258235 A1 | 10/2009 | Tateishi | | JP | 11-017106 | 1/1999 |
| | | | | JP | 11040344 | 2/1999 |
| FOREIGN PATENT DOCUMENTS | | | | JP | 11-149826 | 6/1999 |
| | | | | JP | 11255923 | 9/1999 |
| CA | 2 353 506 | 5/2000 | | JP | 200058258 | 2/2000 |
| DE | 196 03 746 A1 | 4/1997 | | JP | 2002/505969 | 2/2002 |
| DE | 696 15 510 T2 | 6/1997 | | JP | 2003282239 | 10/2003 |
| DE | 10 2004 063 619 A1 | 7/2006 | | JP | 2006-294780 | 10/2006 |
| EP | 0 147 696 B1 | 7/1985 | | WO | WO 87/07848 | 12/1987 |
| EP | 0 299 753 A2 | 1/1989 | | WO | WO 89/00337 | 1/1989 |
| EP | 0 340 935 A2 | 11/1989 | | WO | 91/07519 A1 | 5/1991 |
| EP | 0 390 540 B1 | 10/1990 | | WO | WO 95/10117 | 4/1995 |
| EP | 0 468 440 A2 | 1/1992 | | WO | WO 96/23217 | 8/1996 |
| EP | 0 547 550 A1 | 6/1993 | | WO | WO 97/04885 | 2/1997 |
| EP | 0 590 467 A1 | 4/1994 | | WO | WO 97/16053 | 5/1997 |
| EP | 0 611 037 A1 | 8/1994 | | WO | WO 97/22631 | 6/1997 |
| EP | 0 722 787 A2 | 7/1996 | | WO | WO 98/10116 | 3/1998 |
| EP | 0 777 280 A2 | 6/1997 | | WO | WO 98/18852 | 5/1998 |
| EP | 0 777 281 A2 | 6/1997 | | WO | WO 99/16557 | 4/1999 |
| EP | 0 787 824 A2 | 6/1997 | | WO | WO 99/16931 | 4/1999 |
| EP | 0 787 826 A1 | 6/1997 | | WO | 99/33651 A1 | 7/1999 |
| EP | 0 915 105 A1 | 5/1998 | | WO | WO 99/46120 | 9/1999 |
| EP | 0 916 394 A2 | 5/1998 | | WO | WO 00/26973 | 5/2000 |
| EP | 0 931 850 A1 | 7/1999 | | WO | WO 00/35603 | 6/2000 |
| EP | 0 977 469 A2 | 2/2000 | | WO | WO 00/35604 | 6/2000 |
| EP | 1 021 070 A1 | 7/2000 | | WO | WO 00/35993 | 6/2000 |
| EP | 1 127 381 | 8/2001 | | WO | WO 00/36661 | 6/2000 |
| EP | 1 130 420 A2 | 9/2001 | | WO | WO 00/36665 | 6/2000 |
| EP | 1 278 244 A2 | 1/2003 | | WO | 00/53423 A1 | 9/2000 |
| EP | 1 426 813 A2 | 6/2004 | | WO | 0157904 A1 | 8/2001 |
| EP | 1514317 A1 | 3/2005 | | WO | WO 01/68360 | 9/2001 |
| EP | 1 719 808 A2 | 11/2006 | | WO | WO 01/81649 A1 | 11/2001 |
| EP | 1 857 270 A1 | 11/2007 | | WO | WO 01/82336 A2 | 11/2001 |
| GP | 2 210 826 A | 6/1989 | | WO | WO 01/82389 A1 | 11/2001 |
| JP | S63-96895 | 4/1988 | | WO | WO 01/87825 A1 | 11/2001 |
| JP | 63136316 | 8/1988 | | WO | WO 01/89006 A1 | 11/2001 |
| JP | 6418441 | 1/1989 | | WO | WO 02/26973 | 4/2002 |
| JP | 01041067 | 2/1989 | | WO | 02/051626 A1 | 7/2002 |
| JP | S64-41192 | 2/1989 | | WO | 02071506 A1 | 9/2002 |
| JP | 02183230 | 7/1990 | | WO | WO 03/016589 A1 | 2/2003 |
| JP | 3-183759 | 8/1991 | | WO | WO 03/098716 A1 | 11/2003 |
| JP | 03290375 | 12/1991 | | WO | WO 03/098716 A1 | 11/2003 |
| JP | 4-14440 | 1/1992 | | WO | WO 2004/006199 A3 | 1/2004 |
| JP | 4-48515 | 2/1992 | | WO | WO 2004/016992 A1 | 2/2004 |
| JP | 04267097 | 9/1992 | | WO | WO 2004/070840 A1 | 8/2004 |

| WO | WO 2004/089620 A2 | 10/2004 |
|---|---|---|
| WO | 2004/112165 A1 | 12/2004 |
| WO | WO 2005/015655 A1 | 2/2005 |
| WO | WO 2005/045947 A2 | 5/2005 |
| WO | WO 2005/048368 A1 | 5/2005 |
| WO | 2005050754 A1 | 6/2005 |
| WO | WO 2006/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |
| WO | 2008140313 A1 | 11/2008 |
| WO | 2008142645 A1 | 11/2008 |

OTHER PUBLICATIONS

Wong, F.L., et al., "Long-lifetime thin-film encapsulated organic light-emitting diodes," Journal of applied Physics 104, pp. 0145091-0145094 (2008).

Kim, Han-Ki et al., "Magnetic Field Shape Effect on Electrical Properties of TOLEDs in the Deposition of ITO Top Cathode Layer", Electrochemical and Solid-State Letters, 8 (12), 2005, pp. H103-H105.

Moro, L. et al., "Process and design of a multilayer thin film encapsulation of passive matrix OLED displays", Organic Light-Emitting Materials and Devices VII, Proceedings of SPIE vol. 5214, 2004, pp. 83-93.

De Gryse, R. et al., "Sputtered Transparent Barrier Layers," Tenth International Conference on Vacuum Web Coating (Edited by R. Bakish) aka the $10^{th}$ Bakish Conference; 1996; pp. 190-198.

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In-situ and real-time monitoring of plasma-induced etching PET and acrylic films, Plasma and Polymers, Dec. 1999, 4(4), pp. 1-25.

Affinito, J.D. et al.; Vacuum Deposited Polymer/Metal Multilayer Films for Optical Applications; Paper No. C1.13; International Conference on Metallurgical Coatings; Apr. 15-21, 1995; pp. 1-14.

Affinito, J.D. et al., "Vacuum Deposition Of Polymer Electrolytes On Flexible Substrates" Proceedings of the Ninth International Conference on Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" $43^{rd}$ Annual Technical Conference Proceedings, Denver, Apr. 15-20, 2000, pp. 404-407.

Henry, B.M. et al., "Microstructural and Gas Barrier Properties of Transparent Aluminum Oxide and Indium Tin Oxide Films" $43^{rd}$ Annual Technical Conference Proceedings, Denver, Apr. 15-20, 2000, pp. 373-378.

Affinito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; $43^{rd}$ Annual Technical Conference Proceedings; Denver, Apr. 15-20, 2000; pp. 347-351.

Mahon, J.K. et al.; Requirements of Flexible Substrates for Organic Light Emitting Devices in Flat Panel Display Applications; Society of Vacuum Coaters; $42^{nd}$ Annual Technical Conference Proceedings; Apr. 1999; pp. 456-459.

Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.

Tropsha et al.; Combinatorial Barrier Effect of the Multilayer SiOx Coatings on Polymer Substrates; Society of Vacuum Coaters; $40^{th}$ Annual Technical Conferences Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Solid Monomer Precursors; $45^{th}$ International Symposium of the American Vacuum Society; Nov. 2-6, 1998; pp. 0-26.

Felts, J.T.; Transparent Barrier Coatings Update: Flexible Substrates; $36^{th}$ Annual Technical Conference Proceedings; Apr. 25-30, 1993 pp. 324-331.

Affinito, J.D. et al.; Molecularly Doped Polymer Composite Films for Light Emitting Polymer Application Fabricated by the PML Process, $41^{st}$ Technical Conference of the Society of Vacuum Coaters; Apr. 1998; pp. 220-225.

Affinito, J.D. et al.; Vacuum Deposited Conductive Polymer Films; The Eleventh International Conference on Vacuum Web Coating; Nov. 9-11, 1997; pp. 0-12.

Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.

Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.

Bright, Clark I.; Transparent Barrier Coatings Based on ITO for Flexible Plastic Displays; Thirteenth International Conference on Vacuum Web Coatings; Oct. 17-19, 1999; pp. 247-255.

Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.

Hibino, N. et al.; Transparent Barrier $Al_2O_3$ Coating By Activated Reactive Evaporation; Thirteenth International Conference on Vacuum Web Coatings; Oct. 17-19, 1999; pp. 234-245.

Shi, M.K. et al.; Plasma treatment of PET and acrylic coating surfaces-I. In situ XPS measurements; Journal of Adhesion Science and Technology; Mar. 2000, 14(12); pp. 1-28.

Affinito, J.D. et al.; "PML/Oxide/PML Barrier Layer Performance Differences Arising From Use of UV or Electron Beam Polymerization of the PML Layers;" SVC $40^{th}$ Annual Technical Conference; Apr. 12-17, 1997; pp. 19-25.

Yializis, A. et al.; High Oxygen Barrier Polypropylene Films Using Transparent Acrylate-$A_2O_3$ and Opaque Al-Acrylate Coatings; 1995; pp. 95-102; Society of Vacuum Coaters.

Shaw, D.G. et al.; Use of Vapor Deposted Acrylate Coatings to Improve the Barrier Properties of Metallized Film; 1994; pp. 240-244; Society of Vacuum Coaters.

Affinito, J.D. et al.; "Vacuum Deposited Conductive Polymer Films" The Eleventh International Conference on Vacuum Web Coating, no earlier than Feb. 1998, pp. 200-213.

Bunshah, R.F. et al.; "Deposition Technologies for Films and Coatings" Noyes Publications, Park Ridge, New Jersey, 1982, p. 339.

Affinito, J.D.; Energy Res. Abstr. 18(6), #17171, 1993.

Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.

Affinito, J.D. et al; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.

Graupner, W. et al.; "High Resolution Color Organic Light Emitting Diode Microdisplay Fabrication Method", SPIE Proceedings; Nov. 6, 2000; pp. 11-19.

Czeremuszkin, G. et al.; Permeation Through Defects in Transparent Barrier Coated Plastic Films; $43^{rd}$ Annual Technical Conference Proceedings; Apr. 15, 2000; pp. 408-413.

Vossen, J.L. et al.; Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.

G. Gustafason, et al.; Flexible light-emitting diodes made from soluble conducting polymers; Letters to Nature; Vo. 357; Jun. 11, 1992; pp. 477-479.

F.M. Penning; Electrical Discharges in Gases; 1965; pp. 1-51; Gordon and Breach, Science Publishers, New York-London-Paris.

Affinito, J.D., et al.; High Rate Vacuum Deposition of Polymer Electrolytes; Journal Vacuum Science Technology A 14(3), May/Jun. 1996.

Phillips, R.W.; Evaporated Dielectric Colorless Films on PET and OPP Exhibiting High Barriers Toward Moisture and Oxygen; Society of Vacuum Coaters; 36$^{th}$ Annual Technical Conference Proceedings; 1993; pp. 293-301.

Yamada Y. et al.; The Properties of a New Transparent and Colorless Barrier Film; 1995; pp. 28-31; Society of Vacuum Coaters.

Chahroudi, D.; Transparent Glass Barrier Coatings for flexible Film Packaging; 1991; pp. 130-133; Society of Vacuum Coaters.

Krug, T. et al.; New Developments in Transparent Barrier Coatings; 1993; pp. 302-305; Society Vacuum Coaters.

Affinito, J.D. et al.; A new method for fabricating transparent barrier layers, Thin Solid Films 290-291; 1996; pp. 63-67.

Affinito, J.D. et al.; Polymer-Oxide Transparent Barrier Layers; SVC 39th Annual Technical Conference; Vacuum Web Coating Session; 1996; pp. 392-397.

Hoffman, G. et al.; Transparent Barrier Coatings by Reactive Evaporation; 1994; pp. 155-160; Society of Vacuum Coaters.

Kelmberg-Sapieha, J.E. et al.; Transparent Gas Barrier Coatings Produced by Dual-Frequency PECVD; 1993; pp. 445-449; Society of Vacuum Coaters.

Finson, E. et al.; Transparent $SiO_2$ Barrier Coatings: Conversion of Production Status; 1994; pp. 139-143; Society of Vacuum Coaters.

Affinito, J.D. et al; Ultra High Rate, Wide Area, Plasma Polymerized Films from High Molecular Weight/Low Vapor Pressure Liquid or Liquid/Solid Suspension Monomer Precursors; MRS Conference; Nov. 29, 1998-Dec. 3, 1998; Paper No. Y12.1.

Notice of Allowance dated Dec. 29, 2009 pertaining to U.S. Appl. No. 11/693,022.

Office Action of U.S. Appl. No. 11/693,020 dated Oct. 29, 2009.

Advisory Action of U.S. Appl. No. 10/412,133 dated Apr. 8, 2008.

Advisory Action of U.S. Appl. No. 10/412,133 dated Aug. 8, 2008.

Advisory Action of U.S. Appl. No. 11/112,880 dated Jul. 23, 2009.

Advisory Action of U.S. Appl. No. 11/693,022 dated Oct. 21, 2009.

Election/Restrictions Requirement of U.S. Appl. No. 10/412,133 dated Dec. 28, 2004.

Election/Restrictions Requirement of U.S. Appl. No. 11/112,880 dated Jul. 25, 2008.

Election/Restrictions Requirement of U.S. Appl. No. 11/693,020 dated Aug. 8, 2008.

Election/Restrictions Requirement of U.S. Appl. No. 11/693,022 dated Oct. 7, 2008.

Advisory Action of U.S. Appl. No. 11/068,356 dated Feb. 12, 2008.

Election/Restrictions Requirement of U.S. Appl. No. 11/693,020 dated Jun. 25, 2009.

Election/Restrictions Requirement of U.S. Appl. No. 12/345,912 dated Oct. 27, 2009.

Notice of Allowance of U.S. Appl. No. 11/776,616 dated Sep. 18, 2009.

Office Action of U.S. Appl. No. 11/693,022 dated Jan. 23, 2009.

Office Action of U.S. Appl. No. 10/412,133 dated Mar. 3, 2006.

Office Action of U.S. Appl. No. 10/412,133 dated Mar. 28, 2005.

Office Action of U.S. Appl. No. 11/112,880 dated May 28, 2009.

Advisory Action of U.S. Appl. No. 11/068,356 dated Mar. 30, 2009.

Office Action of U.S. Appl. No. 11/693,022 dated Aug. 18, 2009.

Office Action of U.S. Appl. No. 10/412,133 dated Sep. 5, 2007.

Office Action of U.S. Appl. No. 10/412,133 dated Sep. 7, 2006.

Office Action of U.S. Appl. No. 11/776,616 dated Sep. 26, 2008.

Office Action of U.S. Appl. No. 10/412,133 dated Nov. 3, 2005.

Office Action of U.S. Appl. No. 11/112,880 dated Dec. 3, 2008.

Office Action of U.S. Appl. No. 10/412,133 dated Dec. 11, 2007.

Office Action of U.S. Appl. No. 11/693,020 dated Dec. 30, 2008.

Election/Restrictions Requirement of U.S. Appl. No. 11/068,356 dated Oct. 17, 2008.

Office Action of U.S. Appl. No. 11/068,356 dated Jan. 22, 2009.

Office Action of U.S. Appl. No. 11/068,356 dated Apr. 4, 2008.

Office Action of U.S. Appl. No. 11/068,356 dated Jun. 10, 2009.

Office Action of U.S. Appl. No. 11/068,356 dated Jun. 15, 2007.

Office Action of U.S. Appl. No. 11/068,356 dated Nov. 28, 2007.

Advisory Action dated Dec. 15, 2009 pertaining to U.S. Appl. No. 11/693,020.

Examiner's Answer dated Nov. 12, 2009 pertaining to U.S. Appl. No. 10/412,133.

Office Action dated Dec. 7, 2009 pertaining to U.S. Appl. No. 11/068,356.

Office Action dated Dec. 1, 2009 pertaining to U.S. Appl. No. 11/627,583.

Chwang et al, "Thin film encapsulated flexible organic electroluminescent displays" Applied Physics Letters, vol. 83, No. 3, Jul. 21, 2003, pp. 413-415.

Akedo et al, "Plasma-CVD SiNx/Plasma-Polymerized CNx:H Multi-layer Passivation Films for Organic Light Emitting Diodes" Society of Information Display Digest of Technical Papers, vol. 34, No. 1, May 1, 2003, pp. 559-561.

International Search Report and Written Opinion pertaining to International application No. PCT/US2009/060437 dated Feb. 17, 2010.

International Search Report and Written Opinion pertaining to International application No. PCT/US2009/066518 dated Feb. 15, 2010.

Japanese Office Action pertaining to Japanese Patent Application No. 2003-586919 dated Dec. 16, 2009.

Chinese Office Action pertaining to Chinese Patent Application No. 200580049572.8 dated Jan. 8, 2010.

Notice of Allowance pertaining to U.S. Appl. No. 11/693,022 dated Jan. 28, 2010.

US Office Action dated Mar. 18, 2010 pertains to U.S. Appl. No. 12/345,912.

US Office Action dated Apr. 29, 2010 pertains to U.S. Appl. No. 11/068,356.

Chinese Office Action dated Mar. 18, 2010 pertains to Chinese Appln. No. 200780018584.3.

International Search Report/Written Opinion dated Apr. 1, 2010, Pertains to International Appln. No. PCT/US2009/069788.

European Examination Report dated Mar. 5, 2010 pertaining to European Appln. No. 07 865 280.7.

* cited by examiner

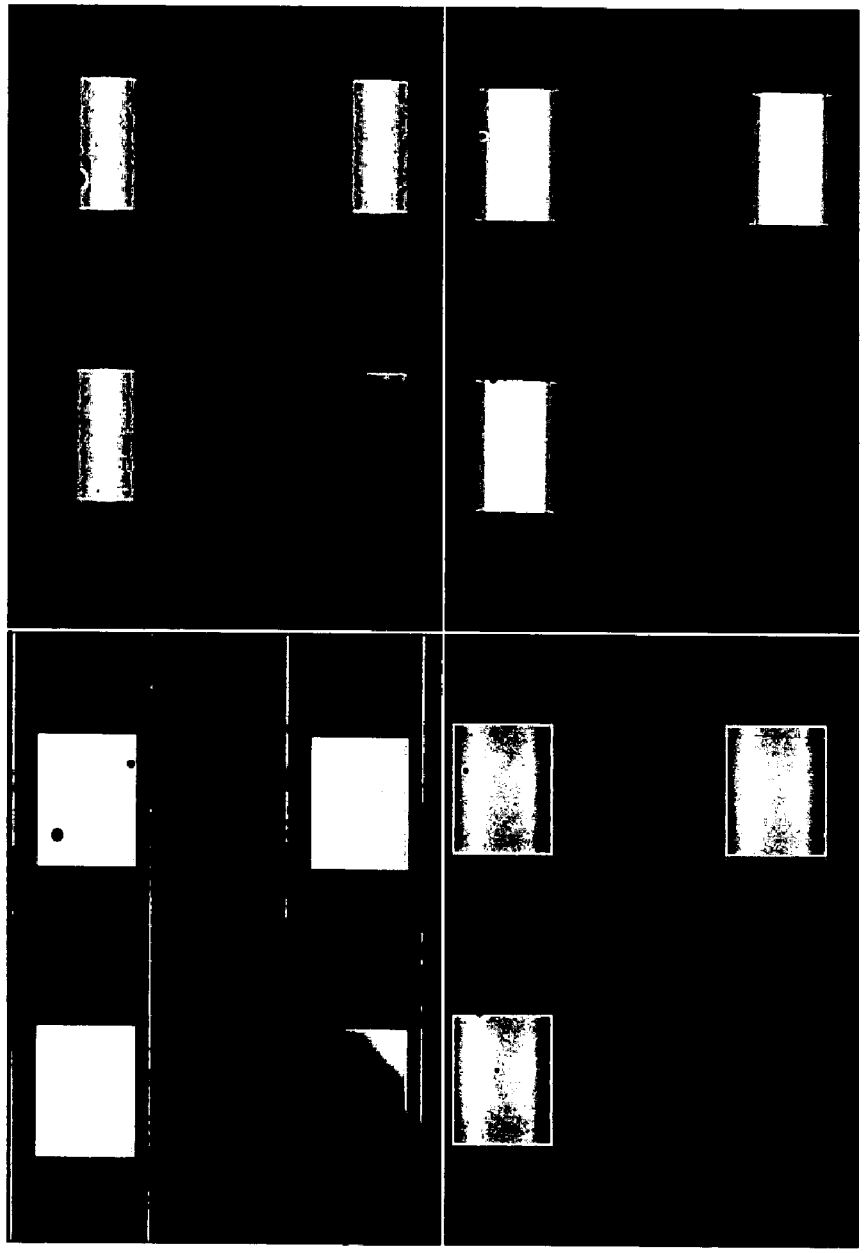

ENCAPSULATED DEVICES AND METHOD OF MAKING

This application claims the benefit of U.S. Provisional Application Ser. No. 60/711,136, filed Aug. 25, 2005, entitled "Encapsulated Devices and Method of Making."

BACKGROUND OF THE INVENTION

The present invention relates generally to encapsulated devices, and more particularly to barriers for encapsulation, and to methods for making layers for said barriers.

Many devices are subject to degradation caused by permeation of environmental gases or liquids, such as oxygen and water vapor in the atmosphere or chemicals used in the processing of the electronic product. Some devices are often encapsulated in order to prevent degradation.

Various types of encapsulated devices are known. For example, U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; and U.S. Pat. No. 6,570,325, entitled "Environmental Barrier Material For Organic Light Emitting Device And Method Of Making", issued May 27, 2003, all of which are incorporated herein by reference, describe encapsulated organic light emitting devices (OLEDs). U.S. Pat. No. 6,573,652, entitled "Encapsulated Display Devices", issued Jun. 3, 2003, which is incorporated herein by reference, describes encapsulated liquid crystal displays (LCDs), light emitting diodes (LEDs), light emitting polymers (LEPs), electronic signage using electrophoretic inks, electroluminescent devices (EDs), and phosphorescent devices. U.S. Pat. No. 6,548,912, entitled "Semiconductor Passivation Using Barrier Coatings," issued Apr. 15, 2003, which is incorporated herein by reference, describes encapsulated microelectronic devices, including integrated circuits, charge coupled devices, light emitting diodes, light emitting polymers, organic light emitting devices, metal sensor pads, micro-disk lasers, electrochromic devices, photochromic devices, microelectromechanical systems, and solar cells.

One method of making encapsulated devices involves depositing barrier stacks adjacent to one or both sides of the device. The barrier stacks typically include at least one barrier layer and at least one decoupling layer. There could be one decoupling layer and one barrier layer, there could be multiple decoupling layers on one side of one or more barrier layers, or there could be one or more decoupling layers on both sides of one or more barrier layers. The important feature is that the barrier stack has at least one decoupling layer and at least one barrier layer.

One embodiment of an encapsulated display device is shown in FIG. 1. The encapsulated display device 100 includes a substrate 105, a display device 110, and a barrier stack 115. The barrier stack 115 includes a barrier layer 120 and a decoupling layer 125. The barrier stack 115 encapsulates the display device 110, preventing environmental oxygen and water vapor from degrading the display device.

The barrier layers and decoupling layers in the barrier stack can be made of the same material or of a different material. The barrier layers are typically about 100-1,000 Å thick, and the decoupling layers are typically about 1,000 Å thick.

Although only one barrier stack is shown in FIG. 1, the number of barrier stacks is not limited. The number of barrier stacks needed depends on the level of water vapor and oxygen permeation resistance needed for the particular application. One or two barrier stacks should provide sufficient barrier properties for many applications, while three for four may be sufficient for most. The most stringent applications may require five or more barrier stacks. Another situation in which multiple barrier stacks may be required is where the thickness of the decoupling layer needs to be limited to limit the stress induced by the polymer shrinkage, such as with passive matrix devices.

The barrier layers can be deposited using a vacuum process, such as sputtering, chemical vapor deposition, plasma enhanced chemical vapor deposition, evaporation, sublimation, electron cyclotron resonance-plasma enhanced vapor deposition (ECR-PECVD), and combinations thereof.

Suitable barrier materials include, but are not limited to, metals, metal oxides, metal nitrides, metal carbides, metal oxynitrides, metal oxyborides, and combinations thereof.

We have found that some of the devices being encapsulated have been damaged by the plasma used in depositing the barrier and/or decoupling layers. Plasma damage has occurred when a substrate with an environmentally sensitive device on it, such as an OLED, is encapsulated with a multilayer barrier stack in which a plasma based and/or assisted process is used to deposit a barrier layer or decoupling layer. For example, plasma damage has occurred when reactively sputtering a barrier layer of $AlO_x$ under conditions suitable for achieving barrier properties, sputtering a barrier layer of $AlO_x$ onto the top surface of an environmentally sensitive device, and/or sputtering a barrier layer of $AlO_x$ on a vacuum deposited, acrylate based polymeric layer.

Plasma damage involves a negative impact on the electrical and/or luminescent characteristics of a device resulting from encapsulation. The effects will vary by the type of device, the manufacturer of the device, and the wavelength of the light emitted. It is important to note that plasma damage is dependent on the design of the device to be encapsulated. For example, OLEDs made by some manufacturers show little to no plasma damage, while OLEDs made by other manufacturers show significant plasma damage under the same deposition conditions. This suggests that there are features within the device that affect its sensitivity to plasma exposure.

One way to detect plasma damage is to observe changes in the I-V-L characteristics of the device.

The decoupling layers can be deposited using a vacuum process, such as flash evaporation with in situ polymerization under vacuum, or plasma deposition and polymerization, or atmospheric processes, such as spin coating, ink jet printing, screen printing, or spraying. U.S. Pat. Nos. 4,842,893, 4,954,371, and 5,032,461, which are incorporated herein by reference, describe a method of flash evaporation and polymerization. Suitable materials for the decoupling layer, include, but are not limited to, organic polymers, inorganic polymers, organometallic polymers, hybrid organic/inorganic polymer systems, and silicates.

It was believed that the primary contribution of the decoupling layer to the barrier performance of a barrier stack was that it prevented defects in one barrier layer from propagating into another. By alternating barrier layers and decoupling layers, defects in one layer tend to be isolated and are not carried forward in the next layer. This creates a longer and more tortuous path for contaminants, such as oxygen and water vapor.

For example, U.S. Pat. No. 5,681,666 (Treger) discusses the importance of the layers of inorganic material being separated by organic material to avoid crack and defect propagation in the inorganic material. Treger indicated that cracks, pinholes, or other defects in an inorganic layer tends to be carried into the next inorganic material layer if the next inorganic material layer is deposited directly onto the first layer of inorganic material with no intervening layer of organic material between the two inorganic layers. According to Treger, this phenomenon significantly reduces the usefulness of the composite as a moisture barrier, since the defects often propagate through all of the inorganic layers if no organic layer is interposed between them.

A similar phenomenon sometimes occurs with respect to organic layers. Thus, a macroscopic or microscopic pinhole, inclusion of a dust particle, etc., can occur during the deposition of the organic layer, and this provides an easy path for water vapor transmission. By depositing alternating organic and inorganic layers, the defects in any particular layer do not tend to propagate into the next layer. This provides a much longer and more tortuous path for the water vapor to go through, even to such an extent that the net result is as though such defects do not exist.

From technical view point, thinner layers and more layers provide more resistance to the transmission of water vapor through the composite. However, the cost of the moisture barrier increases with each layer that is deposited. Also, if the layers are too thin, there will be voids of incomplete coverage in the layers, and this will increase the permeability of the composite.

This thinking is also reflected in "Mechanisms of vapor permeation through multilayer barrier films: Lag time versus equilibrium permeation," G. L. Graff, et al., Journal of Applied Physics, Vol. 96, No. 4, p. 1840 (Aug. 15, 2004), which is incorporated herein by reference. Graff et al. explain that permeation through single and multilayer vapor barriers is controlled by defects, and that defect size and spatial density are the critical parameters for defining barrier performance. Although the long apparent diffusion path caused by separating low defect density inorganic layers from each other with polymer layers significantly increases lag times, the decrease in steady-state flux is much less significant. The increased lag time is primarily responsible for the improvement in barrier performance as additional barrier stacks are added.

Graff et al. suggest that lowering the diffusivity and solubility of the polymer layers will improve the barrier performance. This can be accomplished by polymer selection (hydrophobic moieties or organic/inorganic copolymers), physical modifications (such as ion bombardment or crosslinking), or chemical modification (reactive etch or plasma surface treatment). However, they indicate that the range of improvement that is possible with the polymer layer may be insignificant relative to the improvement of the inorganic layer because the effective diffusion of the inorganic layer is at least four orders of magnitude lower than that of the polymer layers.

There was an underlying assumption that the permeating species reaching and then directly degrading the OLED is the only factor in barrier failure.

It is known that plasma treatments can modify the properties of polymers. Several patents disclose the use of plasma treatment to improve properties for a multi-layer barrier on a substrate. U.S. Pat. No. 6,083,628 discloses plasma treatment of polymeric film substrates and polymeric layers from acrylates deposited using a flash evaporation process as a means of improving properties. U.S. Pat. No. 5,440,466 similarly discusses plasma treatment of substrates and acrylate layers to improve properties. On the other hand, it is known that in some cases plasma and/or radiation exposure degrades the functional properties of polymers. Thus, there is a need for improved polymeric decoupling layers for barrier stacks which are more compatible with all of the available deposition technologies.

SUMMARY OF THE INVENTION

The present invention meets this need by providing a method of encapsulating an environmentally sensitive device. The method includes providing a substrate; placing at least one environmentally sensitive device adjacent to the substrate; and depositing at least one barrier stack adjacent to the environmentally sensitive device, the at least one barrier stack comprising at least one barrier layer and at least one polymeric decoupling layer, wherein the at least one polymeric decoupling layer is made from at least one polymer precursor, and wherein the polymeric decoupling layer has at least one of: a reduced number of polar regions; a high packing density; a reduced number of regions that have bond energies weaker than a C—C covalent bond; a reduced number of ester moieties; increased Mw of the at least one polymer precursor; increased chain length of the at least one polymer precursor; or reduced conversion of C=C bonds.

In another embodiment, the method includes providing a substrate; placing at least one environmentally sensitive device adjacent to the substrate; and depositing at least one barrier stack adjacent to the environmentally sensitive device, the at least one barrier stack comprising at least one barrier layer and at least one polymeric decoupling layer, wherein the at least one polymeric decoupling layer comprises a reaction product of at least one polymer precursor comprising at least one reactive functional group bound to a hydrocarbon, and wherein the polymeric decoupling layer has no more than about $8 \times 10^{20}$ n/ml of ether linkages, and no more than about $4.0 \times 10^{21}$ n/ml side chains.

Another aspect of the invention is an encapsulated environmentally sensitive device. The encapsulated display device includes a substrate; at least one environmentally sensitive device adjacent to the substrate; and at least one barrier stack adjacent to the environmentally sensitive device, the at least one barrier stack comprising at least one barrier layer and at least one polymeric decoupling layer, wherein the at least one polymeric decoupling layer is made from at least one polymer precursor, the at least one polymer precursor having a functionalized hydrocarbon backbone, and wherein the polymeric decoupling layer has no more than about $8 \times 10^{20}$ n/ml of ether linkages, and no more than about $4.0 \times 10^{21}$ n/ml side chains.

BRIEF DESCRIPTION OF THE DRAWINGS

FIG. 11 are photographs showing shrinkage for different polymer formulations before and after aging.

DETAILED DESCRIPTION OF THE INVENTION

Figure 1:
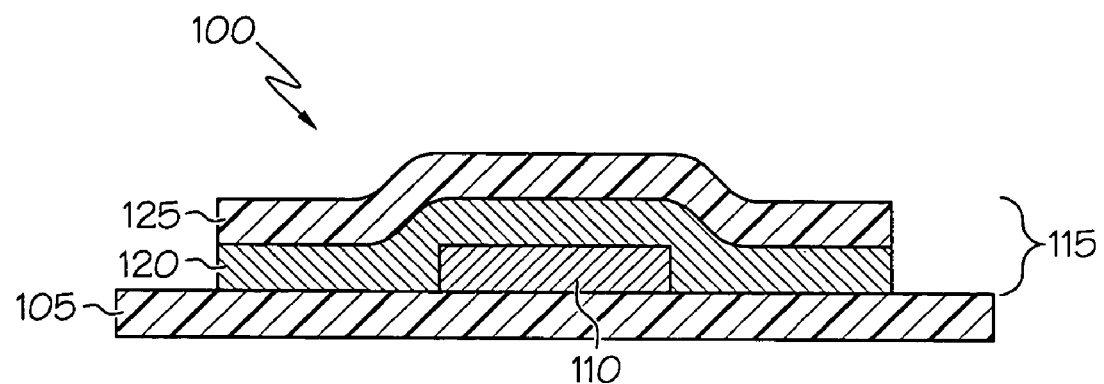
FIG. 1 is a cross-section of a portion of one embodiment of an encapsulated display device.

Conventional teaching with respect to the decoupling layer in a barrier stack suggested that its importance was limited to preventing defects in one layer from propagating into the next. There was no recognition that the decoupling layer can have an important effect on the overall barrier performance, nor was there any discussion of the properties that should be controlled to provide a barrier stack with improved performance. In addition, some of the materials suggested actually result in barrier stacks with inferior performance and/or which are incompatible with the preservation of the electroluminescence performance and the appearance of the device.

Some published literature, for example Graff's "Mechanisms of vapor permeation through multilayer barrier films: Lag time versus equilibrium permeation," model diffusion through the barrier stack by applying a Fickian diffusion model to a multilayer stack using a mathematical model developed by Ash. The general finding obtained from the model that the permeation is controlled by defect density and size in the inorganic layer by creating a tortuous path to the contaminants is valid. However, the assumption of a Fickian diffusion model is generally not suitable for diffusion in a polymer and leads to an underestimation of the role that polymer layers with different characteristics play in the total permeation of the barrier stack.

Furthermore, the effect of polymer stability on overall barrier performance has not been taken into consideration. There has been no recognition of the effect that structural or chemical changes have on the overall barrier performance.

Processes employed for depositing multi-layer barrier stacks on substrates such as polymer films were not believed to impact devices subsequently emplaced adjacent to the stacks. However, we have also discovered that adverse impacts on devices can occur when barrier stack deposition processes include exposure to plasma.

We observed that damage occurred when barrier stacks employing polymeric decoupling layers were deposited prior to emplacement or deposition of an OLED. This damage consisted of black spots with surrounding areas which show a decrease in luminescence. Although not wishing to be bound by theory, we believe that the existence of damage under these conditions suggests that modifications originating from plasma interaction with the polymeric decoupling layer generate reactive species and these migrate through adjacent layers to reach the device and adversely interact with it.

We have discovered that design deficiencies in the polymer layer can lead to failures of the barrier structure that are independent of a permeating species, e.g., plasma damage and shrinkage induced stress. In addition, adverse interaction of polymeric layers with one or more permeating species can result in barrier failures and subsequent early device degradation/failure in advance of what would otherwise be observed if only defects and lag times were involved.

A number of properties of the polymer films have a significant effect on the performance of the barrier stack as a whole. These properties include polymer film morphology, polymer composition, plasma damage, and mechanical stress induced by polymerization. Some of these properties can be affected by changes to the monomer composition as well as by processing parameters.

Polymer morphology is a function of the monomer composition and the degree of cure of the polymer. The effect of polymer composition on barrier failure depends on monomer composition, layer thickness, and degree of curing. Plasma damage is a function of monomer blend composition, monomer structure, degree of cure, and monomer purity (e.g., residual alcohols, acrylic/methacrylic acid, cyclic ether byproducts, and other potential byproducts, etc.) The mechanical stress induced by polymerization depends on monomer composition, monomer molecular weight, polymer Tg, layer thickness, and degree of cure.

This understanding led to a set of design rules for the formulation of the polymer layer in the barrier stack.

The polymer layer should have low solubility of the undesirable permeating species within the layer. The most important permeating species for environmentally sensitive display devices is water. However, other species might also be important in some circumstances. A species which is soluble in a layer will seek to achieve an equilibrium solution/saturation of the layer, which means there is a driving force for the species to enter the layer. This can lead to a weakening and/or reorganization of the structure of the polymeric layer, causing adhesion failures and may, in severe cases, result in swelling (a dimensional change) that induces catastrophic interlayer separations or damage to the barrier layer.

The undesirable species (again, in most cases this will be water) should have low diffusivity through the polymer layer. The polarity or non-polarity of the permeating species, the size of the permeating species, the polarity or non-polarity of the polymeric layer and its conformation (3D dimensions), the packing density of the chains within the polymeric layer, H-bonding, etc. all come into play because a permeating species can interact with the medium it is permeating, and the interaction can impact the rate of permeation. Non-interaction through an open network will obviously result in the highest rates of diffusion. Thus, it is not sufficient for a polymeric layer just to be hydrophobic in order for it to be a good choice for a layer to be a moisture barrier. The polymer can be hydrophobic and non-interactive with a water molecule, but if it also has an open structure with widely spaced chains, the water can move through the layer and not be slowed by any interaction with sites on the polymer chains. The concentration of water vapor/water molecules will not be high, but the residence time will be short and so a large amount can move through the layer in relatively short periods of time.

The polymer layer should have resistance to damage when exposed to plasma. Actual experience with the phenomena involves exposure to plasma during reactive sputtering of aluminum oxide using conditions that produce a thin, dense layer that has barrier properties. However, plasma exposure damage to a polymer layer is assumed to be a more general phenomena and may include exposure to plasma used for surface treatments (adhesion promotion, etc.).

Finally, the polymer layer should demonstrate low mechanical stress transmitted by the polymeric layer to adjacent surfaces (i.e., low shrinkage). The significant issue is shrinkage/contraction during cure of a precursor blend, but casting from a solvent solution (polymer is in solution in a solvent which is evaporated leaving only a layer of the polymer) can also result in assorted stresses.

With respect to solubility and diffusivity, the formulations should be designed to have a reduced number of polar regions (e.g., ether linkages), thereby improving the resistance of the resulting film to water. Polymer films made from such formulations demonstrate a significant increase in structural stability (i.e., do not swell or significantly change their structural morphology) upon exposure to water. An example of these types of materials are those with saturated hydrocarbon backbones.

The formulations should also be selected to have a high packing density in the resulting film to reduce the migration of moisture though the polymer film. Packing density can be controlled by changing the structure of the monomers. For high packing density, materials without branching should be used, as well as materials with minimal branching such as the polybutadiene dimethacrylate. One example of low packing density monomers would be those with methyl branches on the backbone. Others include caged materials such as isobornyl acrylate/methacrylate, tricyclodecane dimethanol diacrylate and the norbornene based polymers.

Packing density can also be controlled by the number of cross linking site in the system. In some cases, more reactive sites will actually cause the polymer to hit the gel point faster, thereby preventing further reaction and movement of the reactive site, and this can leave "voids" in the resulting polymer. Changing the trifunctional component can have that effect because some are more flexible and will react further than others.

Packing density can also be controlled by changing the UV dose used for curing. Undercured polymer will swell more. These issues are discussed in more detail below.

With respect to plasma damage, the formulations should be designed to have a reduced number of regions that have weaker bond energies than a typical c-c covalent bond (e.g., ether linkages, ester bonds, C—S bonds), thereby improving the resistance of the resulting film to a plasma. Beyond reducing these moieties in the monomer backbone, it can also be advantageous to limit the number of esters moieties in the resulting polymer. One example of such a material is polybutadiene dimethacrylate.

In some instances, it is advantageous to minimize the $N/(N_c-N_o)$ ratio (where N is the total number of atoms in the monomer unit, $N_o$ represent the number of oxygen atoms on a monomer unit, and $N_c$ is the number of carbon atoms). This ratio is termed the Ohnishi parameter in the literature. Ghoken et al., Dry Etch Resistance of Organic Materials, J. Electrochem. Soc.; SOLID-STATE SCIENCE AND TECHNOLOGY Vol. 130, No. 1 January 1983), which is incorporated herein by reference.

With respect to polymer shrinkage, the formulations should be designed to have reduced cure induced shrinkage stress. 1. Increased Mw and/or chain length in the mono, di and trifunctional components in the formulation. 2. Use reactive oligomers, polymers, or high Mw non-reactive polymers delivered in a solvent system. 3. Reduction of packing density in the polymer film by the addition of certain types of acrylate/methacrylate materials. Examples include: long chain length monofunctional acrylates/methacrylates, such as lauryl acrylate, and stearyl acrylate; cage or ring structure acrylates/methacrylates, such as isobornyl acrylate/methacrylate, tricyclodecane dimethanol diacrylate, tricyclodecane dimethanol diacrylate, and reactive hyper-branched materials (e.g., reactive hyper-branched acrylates). 4. Reducing the conversion of C=C to reduce shrinkage through the hindrance of reaction sites or curing the system to lesser degree than theoretically or practically possible. 5. Use of other chemistries that have reduced cure shrinkage. Examples include: thiol-ene type chemistries that undergo step growth as opposed to a chain growth mechanism; norbornene and norbornene-thiol type chemistries; and epoxy based chemistries.

Materials with a shrinkage greater than about 15% by volume should be avoided. Desirably, the materials should have a bulk shrinkage of less than about 15% by volume, less than about 10% by volume, or less than about 5% by volume for multilayer stacks where the polymer layers have thickness in the range of about 1,000 to about 10,000 Å.

The use of these design rules is device and application dependent. For example, on one type of device structure, shrinkage may not be an issue, but the materials/structure for the OLED may be very sensitive to the products generated from plasma damage to the poly layer. In that case, the emphasis would be placed on using materials with better plasma damage resistance and not focus as much on the shrinkage. In other cases, the device may not be as sensitive to water, but may be sensitive to shrinkage and plasma damage, and materials would be selected that address those issues.

Stacks can also be built using multiple types of formulations to address various device issues. For instance, the polymer layer close to the device may have very low shrinkage to protect the device structure but poor moisture resistance, while the rest of the polymer layers in the barrier stack have higher shrinkage but much better moisture resistance.

Examples illustrating these design rules follow. Although most, but not all, of the examples relate to acrylate and methacrylate chemistry deposited by vacuum evaporation, the design rules indicate that other types of polymer chemistries could be used. Examples of other polymer chemistries that could be used in vacuum evaporation processes include, but are not limited to: urethanes; cationic polymers; acrylate oligomers; thiol-ene systems (step growth polymerization mechanism); thiol-acrylate systems (step growth polymerization mechanism); and epoxide (ring opening) monomers/oligomers. U.S. Pat. No. 6,506,461 describes flash evaporation and polymerization of urethanes and various reactive groups which can be used as polymer precursors. U.S. Pat. No. 6,498,595 describes a cationic polymerization approach and various reactive groups which can be used as polymer precursors.

Alternative deposition techniques can be used to form the polymer layer, including, but not limited to, inkjet, screen printing, spin coating, blade coating, etc. Alternative deposition technologies allow chemistries to be used that may not be compatible with vacuum evaporation processes. Examples of these polymer chemistries include, but are not limited to: acrylate and methacrylate oligomer based systems; acrylate monomers with a large molecular weight mismatch, e.g., isobornyl acrylate and ethoxylated (3) trimethylolpropane triacrylate; acrylate oligomers such as polybutadiene diacrylate; thiol-ene systems (step growth polymerization mechanism); thiol-acrylate systems (step growth polymerization mechanism); polymers in solution with a solvent, such as isobornyl based polymers, polybutadiene, etc.; and epoxide (ring opening) monomers/oligomers.

One factor that should be considered in selecting the polymer is the polymer film morphology. This can be evaluated by aging samples and observing the film for morphology changes, discoloration, and/or spectral shift of transmitted light through a multilayer stack that includes the polymer layers, which are indicators of structural changes in the polymer layer. These changes can have several negative effects on the performance of the barrier stack. Structural changes can damage the integrity of thin barrier layers (e.g., barrier layers less than 100 nm). They can also cause a decrease in the adhesion between layers. In addition, they can alter the optical properties of the barrier stack (e.g., they can lead to a shift in the transmission maxima and minima). This would be particularly important for applications in which the light is emitted through the barrier layer, such as encapsulated top or bottom emitting devices on flexible substrates).

EXAMPLE 1

Polymer films were made using different blends of acrylate monomers. The formulations are shown in Table 1. Polymer layers made using tripropyleneglycol diacrylate have been described in, for example, "Plasma treatment of PET and acrylic coating surfaces-I. In-situ XPS measurements," Shi, et al., J. Adhesion Sci. Technol., Vol. 14, No. 12, pp 1485-1498 (2000), which is incorporated herein by reference. Formulation 1, which incorporates tripropyleneglycol diacrylate, has been used as a basis for comparison for the other formulations.

formed in different planes within the polymer layer. The formation of the bumps in deeper polymer layers produced by later diffusion of moisture may lead to the loss of adhesion between polymer and oxide layers and/or the introduction of defects in the oxide layers.

Figure 5A:
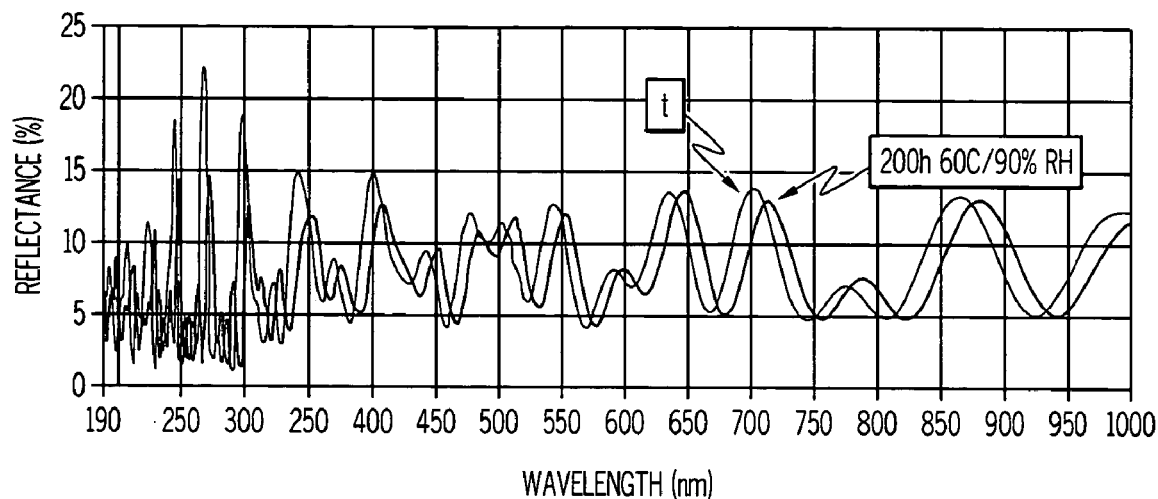
FIG. 5 are graphs showing interference spectra for different polymer formulations before and after aging.
Figure 5B:
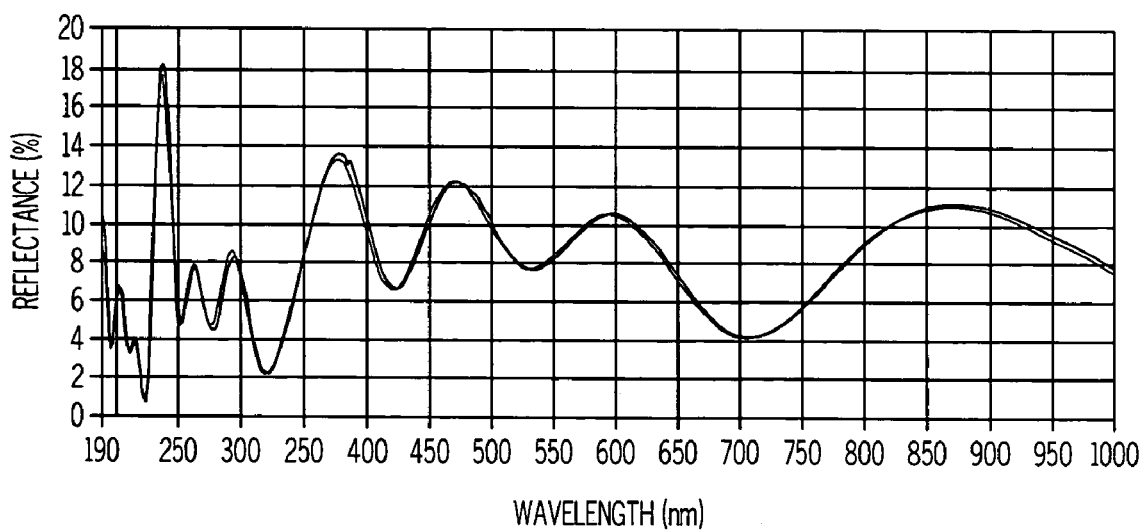

Spectral shift is a change in the interference spectra peak maxima position of more than 5 nm after aging more than 200 hr at 60° C. and 90% RH for transmitted light through the multilayer stack. The largest spectral shift, about 20 nm, occurred with formulation 6, as shown in FIG. 5A. Formulation 6 contains an esterdiol diacrylate (SR606A available from Sartomer Co. Inc., Exton Pa.). Formulation 3 showed no spectral shift, as shown in FIG. 5B.

Figure 5C:
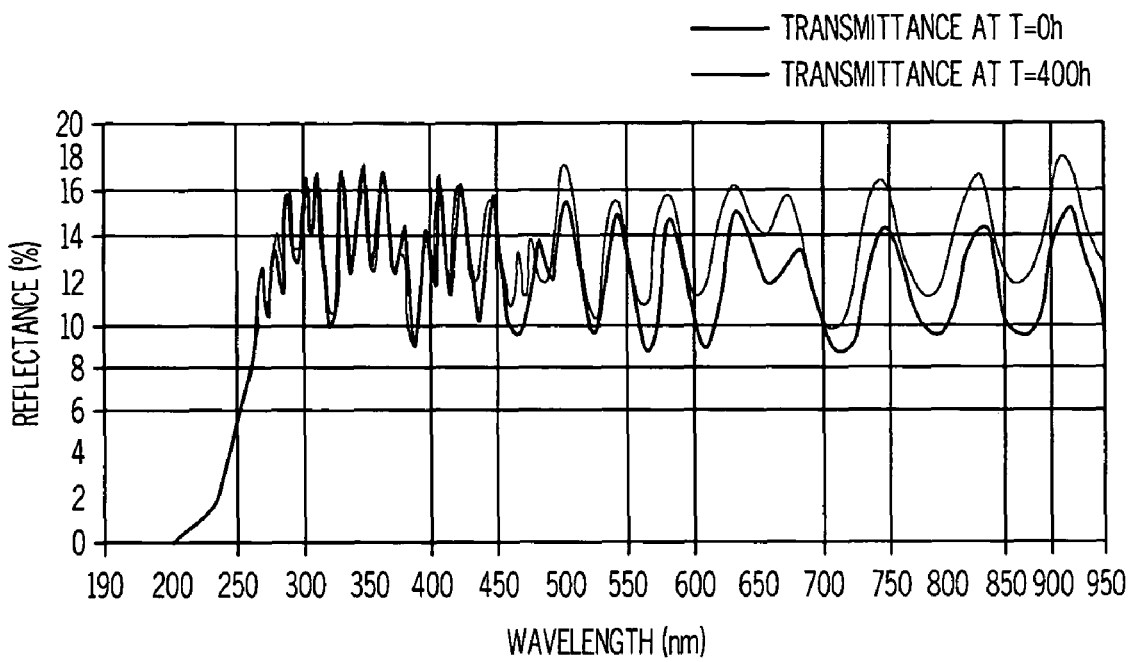
Figure 5D:
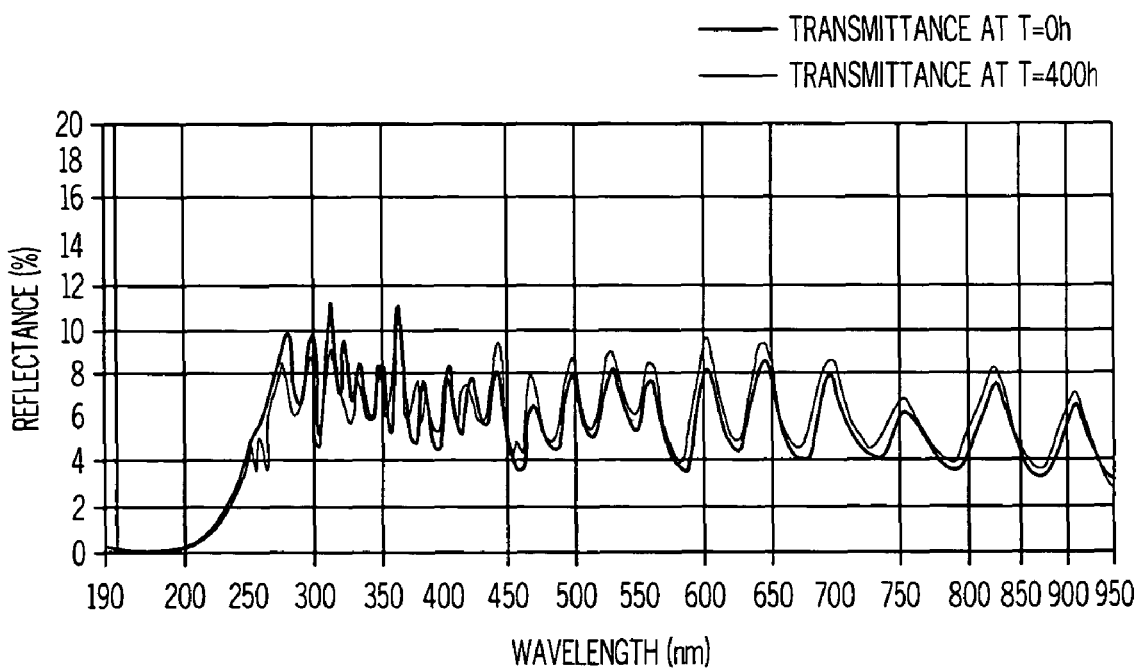

FIGS. 5C and 5D show the spectral shift for formulations 1 and 2 after 400 hr aging. Formulation 1 shows a spectral shift of 15 nm, while formulation 2 shows no spectral shift.

Curing conditions can affect the morphology of the polymer. Polymer films were cured with different doses, described in the table and aged for more than 300 hr at 60° C. and 90% RH. The results are shown in Table 2.

TABLE 2

| UV Dose | Formulation 1 | Formulation 2 |
|---|---|---|
| 90-100% UV @ 30 cm/min | 3 nm | 0 nm |
| 60% UV @ 75 cm/min | 15 nm | 0 nm |
| 30% UV @ 75 cm/min | 15 nm | 9 nm |

TABLE 1

| | Component Wt % | | | | | | |
|---|---|---|---|---|---|---|---|
| Component | 1 | 2 | 3 | 4 | 5 | 6 | 7 |
| Methoxy Tripropyleneglycol Acrylate | 3.5 | | | | | | |
| Lauryl Acrylate | | 17.4 | 23.2 | 22.2 | | | |
| Hexanediol Diacrylate (HDODA) | | | 65.1 | 62.2 | | | 19.5 |
| Tripropyleneglycol Diacrylate (TPGDA) | 69.6 | | | | | | |
| Dodecanediol Dimethacrylate | | 73.5 | | | | | |
| Propoxylated Hexanediol Diacrylate | | | | | 93.0 | | |
| Trimethylolpropane Triacrylate (TMPTA) | | 8.0 | 10.6 | | | | |
| Triethoxy Trimethylolpropane Triacrylate | | | | 14.5 | | | |
| Esterdiol diacrylate | | | | | | 99 | |
| Polyfunctional Adhesion Promoter | 19.8 | | | | | | |
| Polybutadiene Dimethacrylate | | | | | | | 79.4 |
| Photoinitiator 1 | | 1.1 | 1.1 | 1.1 | | 1 | 1.1 |
| Photoinitiator 2 | 7.1 | | | | 7.0 | | |
| $T_g$ (by DMA, * literature value) | 62° C. | 107° C. | 88° C. | 75° C. | 14° C.* | — | −75° C.* |
| Ohnishi parameter | 4.7 | 3.6 | 4.1 | 4.2 | 4.5 | 4.6 | 2.6 |
| Calculated Shrinkage (at 100% conversion) | 16.0 | 13.8 | 19.7 | 20.4 | 12.4 | 16.4 | 0.5 |
| Approximate Number of ether bonds (n/ml) | $3.6 \times 10^{21}$ | 0 | 0 | $5.5 \times 10^{20}$ | $3.2 \times 10^{21}$ | 0 | 0 |
| Approximate Number of ester bonds (n/ml) | $3.5 \times 10^{21}$ | $3.8 \times 10^{21}$ | $4.9 \times 10^{21}$ | $4.7 \times 10^{21}$ | $3.2 \times 10^{21}$ | $5.2 \times 10^{21}$ | $1.4 \times 10^{21}$ |
| Approximate Number of side chains (n/ml) | $4.5 \times 10^{21}$ | 0 | 0 | 0 | 0 | $6.9 \times 10^{21}$ | $2.8 \times 10^{21}$ |

Figure 2A:
FIG. 2 are photographs showing polymer film morphology for different polymer formulations after aging.
Figure 2B:

The samples were aged for 100 hr at 60° C. and 90% RH. Pictures were taken at 200× magnification with differential interference contrast. FIG. 2A shows the formation of bumps in the polymer layer of formulation 1. Formulation 4 has very few bumps in the film, as shown in FIG. 2B.

Figure 3C:
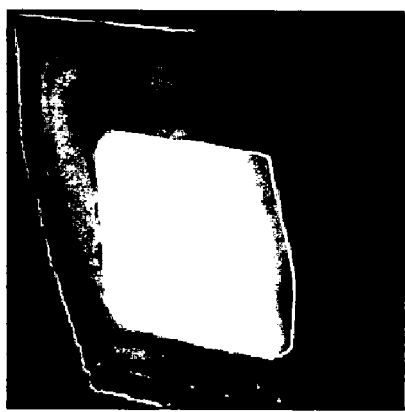
FIG. 3 are photographs showing polymer film discoloration and morphology for different polymer formulations after aging.
Figure 3D:
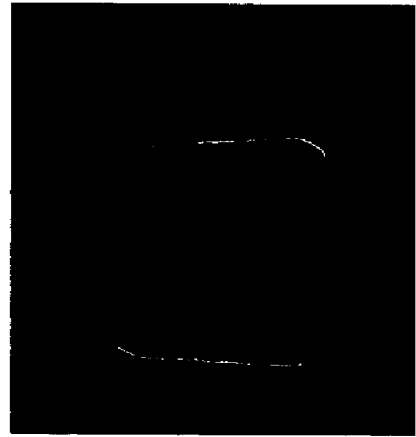
Figure 3A:
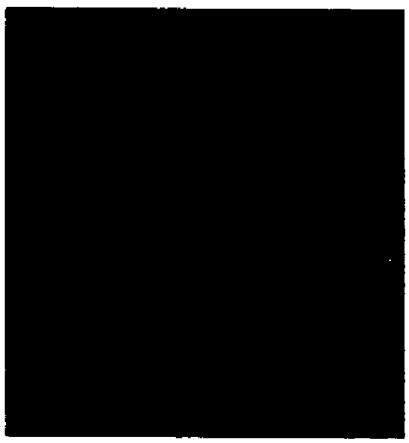
Figure 3B:
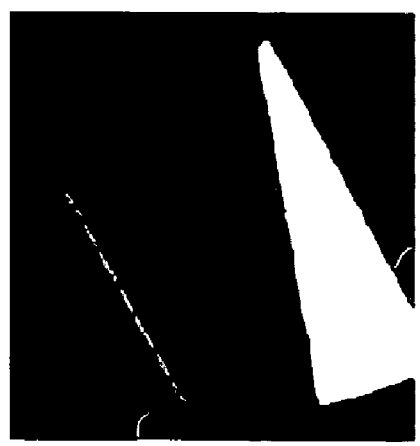

After 400 hr at 60° C. and 90% RH, visual changes can also be seen between different formulations. Formulation 1 showed discoloration (FIG. 3A) and surface morphologies (FIG. 3B), while formulation 2 did not (FIGS. 3C and 3D).

Figure 4A:
FIG. 4 are photographs showing polymer film morphology for different polymer formulations after aging.
Figure 4B:
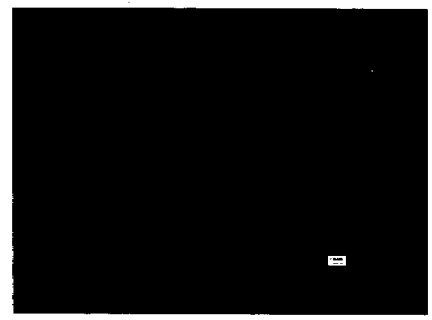
Figure 4C:

FIG. 4A shows an image (50× magnification) of the surface of a stack made with formulation 1 after being aged for 100 hr at 60° C. and 90% RH, and FIG. 4B shows it after being aged for an additional 150 hr. FIG. 4C is a portion of FIG. 4B at a magnification of 200×, and it shows that the bumps are The results demonstrate that the more complete the cure, the lower the spectral shift regardless of the formulation. In addition, differences exist between the formulations at all cure levels. Formulation 1 has a higher spectral shift at all cure levels than formulation 2 does. The main component in formulation 1 is tripropyleneglycol diacrylate which has two ether linkages in the backbone, making it a hydrophilic polymer, as well as two methyl groups. The hydrophilic polymer reacts with the moisture. In contrast, the main components in formulation 2 are aliphatic hydrocarbons (no ether linkages), making it a hydrophobic polymer, with no methyl groups. The hydrophobic polymer does not react with moisture.

Another factor which should be considered in selecting a polymer is the influence of the composition on different mechanisms by which the polymer can contribute to barrier failure. One way barrier failure can be detected is by the corrosion of metallic calcium coupons on glass encapsulated with multilayer barrier stacks. The formation of transparent calcium oxide and hydroxide by permeation of moisture through the barrier increases the transmission of visible light through the film.

EXAMPLE 2

Figure 6A:
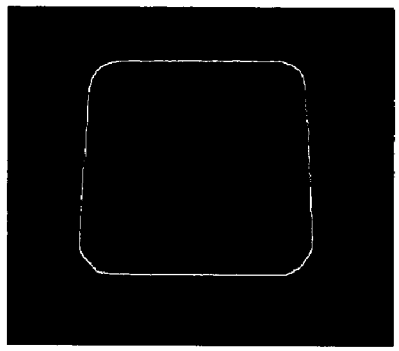
FIG. 6 are photographs showing calcium tests for different polymer formulations after aging.
Figure 6B:
Figure 6C:
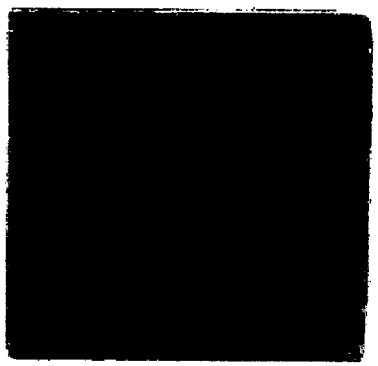
Figure 6D:
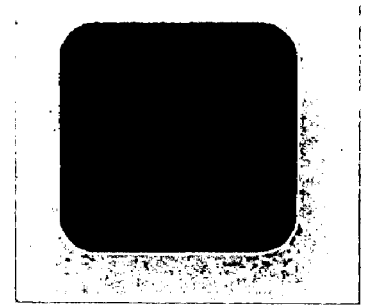

The change in transmission of Ca coupons on glass substrates encapsulated with a multilayer barrier is a good vehicle to test the effectiveness of barrier structures. In the examples shown in FIG. 6A-C the multilayer structure was constituted by an oxide layer 100 nm thick and 6 polymer/oxide pairs [polymer (0.5 μm)/oxide (40 nm)]. Encapsulated Ca coupons were aged for 400 hr at 60° C. and 90% RH. FIG. 6A shows that formulation 4 ($5.5 \times 10^{20}$ n/ml of ether linkages) has no increased transmission, and thus, no barrier failure. FIG. 6B shows that formulation 1 ($3.6 \times 10^{21}$ n/ml of ether linkages) has increased transmission at the edges of the calcium area. In FIG. 6C, the entire calcium area is fading, indicating extreme barrier failure for formulation 5 ($3.2 \times 10^{21}$ n/ml of ether linkages). FIG. 6D shows a Ca coupon with a multilayer structure constituted by an oxide layer 100 nm thick and only 3 polymer/oxide pairs (polymer (0.7 μm)/oxide (40 nm)). The polymer layer was made with Formulation 7 in Table 1. The formulation is based on polybutadiene dimethacrylate (PBDM) and was deposited by spin-on coating. The sample was aged for 500 hr at 60° C. and 90% RH. FIG. 6D shows that formulation 7 (0 n/ml of ether linkages) has no increased transmission, and thus, no barrier failure.

Figure 7A:
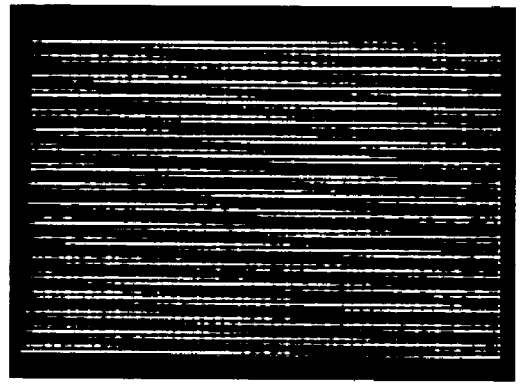
FIG. 7 are photographs showing passive matrix displays for different polymer formulations before and after aging.
Figure 7B:
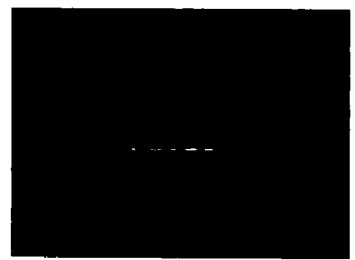
Figure 7C:

Barrier failure leads to OLED display degradation. Large non-emitting areas appear on the displays. FIG. 7A shows a passive matrix display before aging. FIG. 7B shows a display with formulation 1 after 650 hr at 60° C. and 90% RH. FIG. 7C shows a display with formulation 2 after 650 hr at 60° C. and 90% RH. Formulation 2 shows much less degradation than formulation 1.

Another factor that should be considered in selecting a polymer is plasma damage to the polymer layer.

Figure 8A:
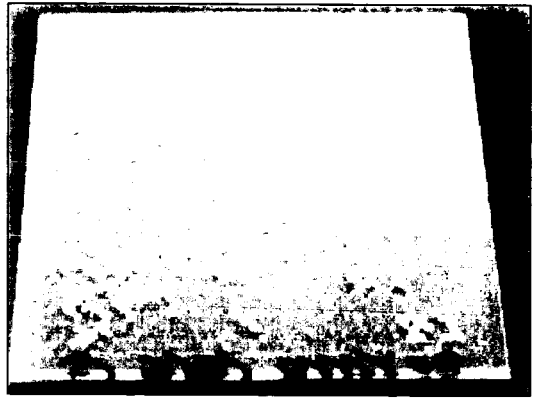
FIG. 8 are photographs showing plasma damage for different polymer formulations after aging.
Figure 8B:
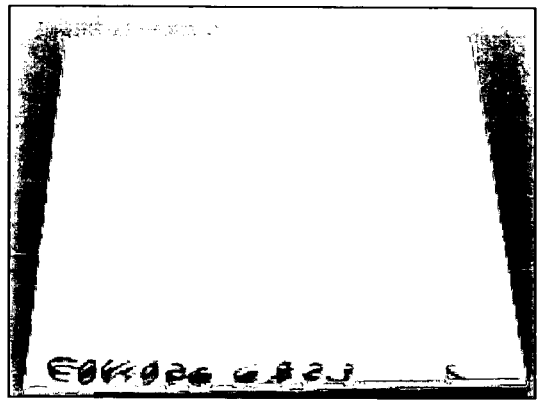
Figure 8C:
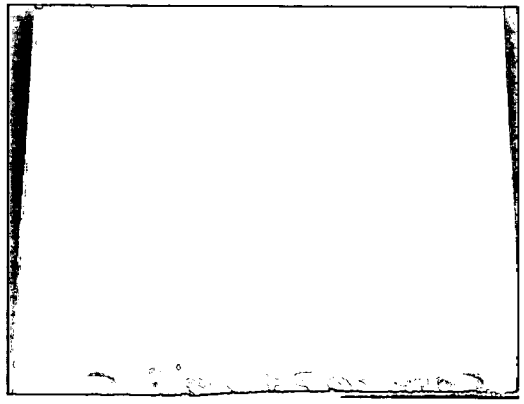
Figure 8D:
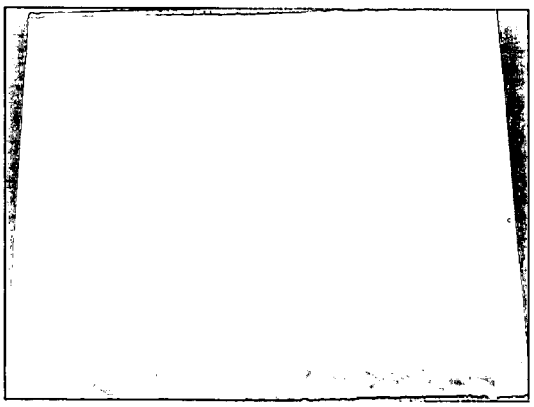

One way to evaluate plasma damage is to expose a barrier stack which has previously been exposed to plasma to UV/ozone. FIG. 8A shows severe bubbling after exposure to UV/ozone for 15 min for a barrier stack made with formulation 1 ($3.6 \times 10^{21}$ n/ml of ether linkages; 4.7—Ohnishi parameter), while there were only two bubbles for the barrier stack made with formulation 2 (0 n/ml of ether linkages; 3.6 Ohnishi parameter), as shown in FIG. 8B. FIGS. 8C and 8D show that for the barrier stack made with formulation 7 (0 n/ml of ether linkages; 2.6—Ohnishi parameter) based on PBDM, no bubbles appeared following UV/ozone exposure in the same conditions described above. In this case, the polymer layers were deposited by a spin-on process.

Plasma damage can also be assessed using OLED test pixels. Black spots, which are microscopic non-emitting areas, form by diffusion of reactive species produced by plasma damage.

EXAMPLE 3

Barrier stacks were formed on OLED test pixels using various polymer formulations. The samples were stored for 500 hr and tested in a dry box to avoid exposure to moisture. Differences were visually observed within 24 hr.

Figures 9A, 9B, 9C, 9D:
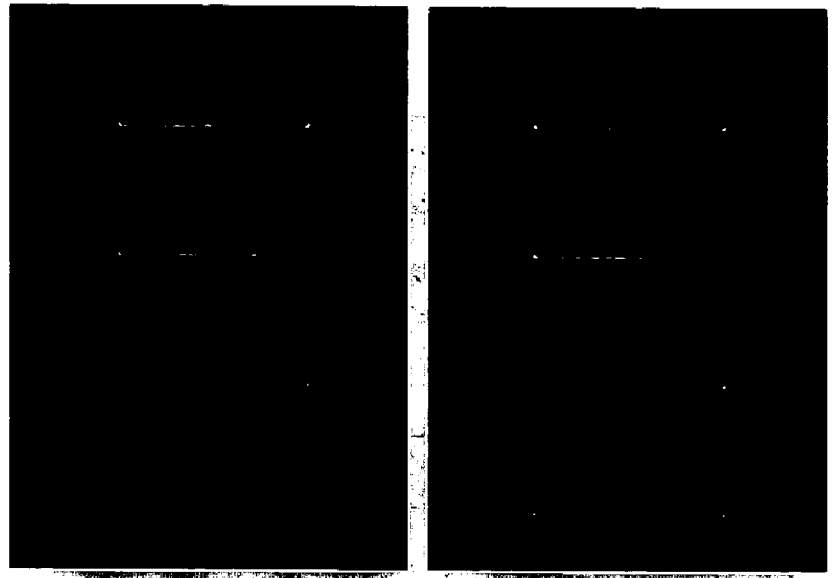
FIG. 9 are photographs showing plasma damage for different polymer formulations before and after aging.

FIG. 9A shows formulation 1 ($3.6 \times 10^{21}$ n/ml of ether linkages; 4.7—Ohnishi parameter) after coating, and FIG. 9B shows the appearance of black spots after storage. FIG. 9C shows formulation 4 ($5. \times 10^{20}$ of ether linkages; 4.2—Ohnishi parameter) after coating, while FIG. 9D shows that no black spots appeared after storage.

Polymeric decoupling layers can be formed from blends of one or more reactive precursors. These will have one or more reactive groups per unit (molecule) that undergo a linking/cross-linking reaction. The reactive groups born by all members of the blend may be the same (e.g., acrylic, methacrylic and vinyl), which self react and/or undergo addition reactions to form chains (e.g. polymethylmethacrylate or polyvinyl acetate). A distinction of this approach is that monofunctional precursors (those bearing one reactive group) will form an extended chain via addition, but crosslinking between chains and branching will be minor to absent. The reactive groups can also be different (isocyanate mixed with hydroxy, isocyanate mixed with amino, or epoxy mixed with amino), which co-react to form cross-links between the precursors. A distinction here is that formation of polymers requires that each species of reactant bear at least two functional groups; monofunctional versions of either will act as blocks/chain terminators.

A consideration in selecting the precursor blend is the structure of the precursor excluding the functional group or groups. One or more precursors is preferably a hydrocarbon that is typically linear or cyclic. These may be further characterized as saturated, e.g., functionalized linear dodecanes or tricyclodecanes. By saturated, we mean that the hydrocarbon does not include any double or triple bonds. Alternatively, they may be unsaturated, with one or more double (or triple) bonds, e.g., functionalized polybutadienes, or they may be based on aromatics, e.g., functionalized diphenylmethanes. Further, the hydrocarbon is characterized by a limited presence of side chains and pendent, activated methyl groups. Finally, when crosslinking is based on additional reactions of monofunctional precursors, consideration has to be given to the structure of the hydrocarbon because these will become pendent moieties spaced along a chain that can, if excessively large, result in open (chains are widely spaced) polymeric layers.

Another consideration in selecting the precursor blend is to avoid structures based on, or that include, polyethers (carbon-oxygen-carbon linkages, e.g., polyethylene glycol and polypropylene glycol) essentially as the structure bearing the reactive group, or as a portion of a larger structure that may include a hydrocarbon. The latter versions are commonly referred to as ethoxylated or propoxylated versions of the parent hydrocarbon. In "Plasma treatment of PET and acrylic coating surfaces-I. In-situ XPS measurements," Shi, et al., J. Adhesion Sci. Technol., Vol. 14, No. 12, pp 1485-1498 (2000), which is incorporated herein by reference, the structural and compositional modifications induced by nitrogen and argon plasma exposure on PET (aromatic structure) and an acrylic polymer are discussed in the context of treatments to improve adhesion. The comparison between a polymer with aromatic structure (PET) and tripropyleneglycol diacrylate, the main component of Formulation 1, is done showing how structural changes are much stronger for the latter polymer and are strongly correlated with the destruction upon irradiation of ether and ester groups. The higher rate of destruction of ether groups compared to ester groups is also discussed. By comparing the destruction of ester groups in PET and the acrylic polymer, faster in the latter, it is also speculated how ether groups accelerate the damage. Although this and similar experimental data have been widely available in literature, to our knowledge no one has correlated them to possible damage in the encapsulated OLED devices by the decomposition of the formed radical by-products (e.g., CO and $CO_2$) trapped in the barrier structure.

Still another factor that should be considered in selecting a polymer is the mechanical stress induced by polymerization. With certain types of OLED devices, the shrinkage that occurs during the cure of the monomer through the formation of covalent bonds can lead to mechanical and/or structural damage. This has been demonstrated in a photoluminescence study of passive matrix OLED devices.

The light emitting polymers emit light when stimulated by light (photoluminescence (PL)) or electricity (electroluminescence (EL)). A structure emitting light by EL is the basic foundation of OLED devices. Comparing the PL and EL images of a given OLED device shows which areas of the polymer have been degraded and have lost the characteristics that allow them to emit light vs. those that have lost electrical contact.

Figure 10A:
FIG. 10 are photographs showing the electroluminescence and photoluminescence of encapsulated and unencapsulated devices before and after aging.
Figure 10B:
Figure 10C:
Figure 15A:
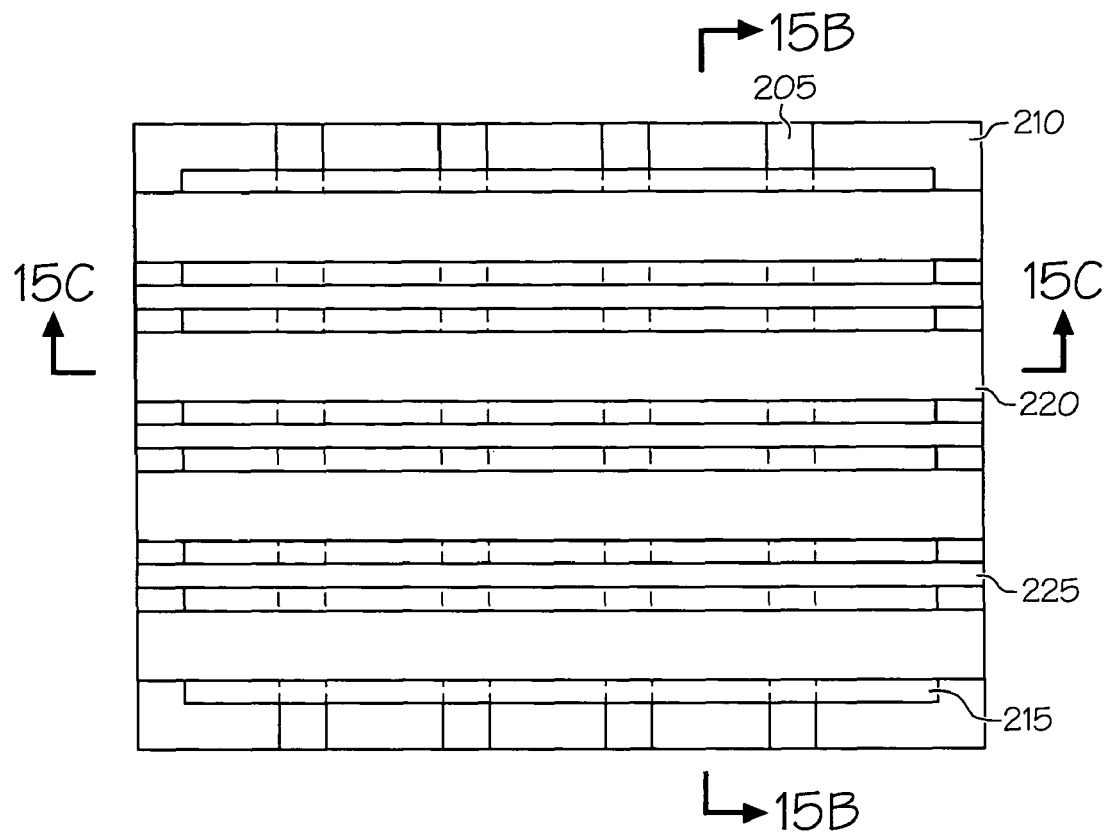
FIG. 15A is a top plan view of a passive matrix device.
Figure 15B:
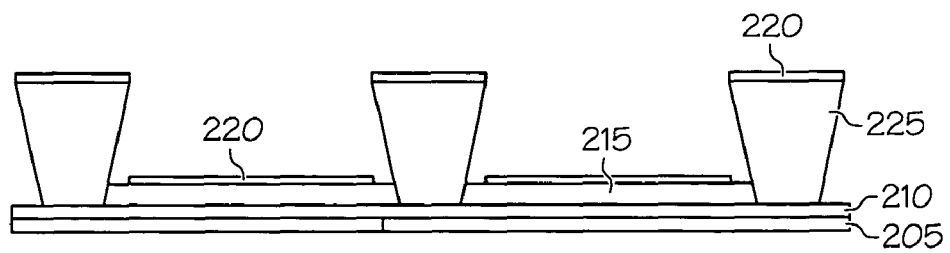
FIGS. 15B and 15C are cross-sections of the passive matrix device of FIG. 15A along lines 15B-15B and 15C-15C.
Figure 15C:
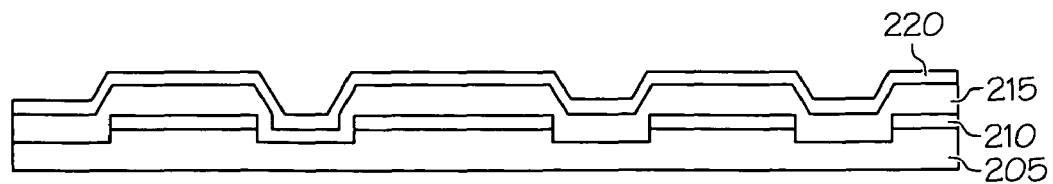

FIGS. 10A-10C show the EL, PL and EL+PL images of a device encapsulated with a high shrinkage process and material (formulation 1). A sketch of a passive matrix (PM) device is shown in FIG. 15A-C. A glass substrate 205 is covered with a layer of indium tin oxide (ITO) 210. The ITO layer 210 is removed from portions of the device. There is a polymer light-emitting diode/polyethylenedioxythiophene (PLED/PDOT) layer 215 over the ITO layer 210. The aluminum cathode layer 220 is over the PLED/PDOT layer 215. There are cathode separators 225 which separate the aluminum cathode layer 220.

The sample was not exposed to moisture after encapsulation or before testing (there was exposure to moisture during shipping before coating). The so called "black spots" (localized areas where the contact was deteriorated by chemical reaction with a reactive species (mostly water, oxygen, or other species containing oxygen (e.g., $CO_2$)) were present before coating and originate from moisture exposure during shipping. The EL luminescence image 10A shows that only a thin central area of the almost square pixels emits light when stimulated by current. The thin strip is decorated by the black spots created during shipping. FIG. 10B shows the PL image of the same area. In this picture, the full area of the pixels emits light. All over the pixel area brighter spots corresponding to the chemically deteriorated contact areas forming "black spots" are evident. FIG. 10C is an image taken with the two simultaneous stimulations (current and light) and allows an easier comparison of the different features.

Figure 10D:
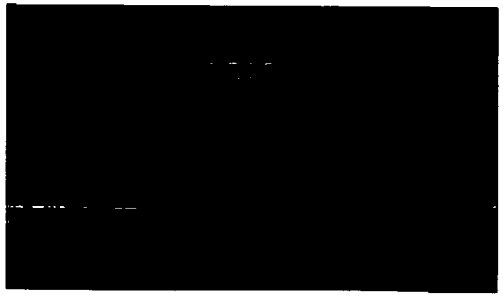
Figure 10E:
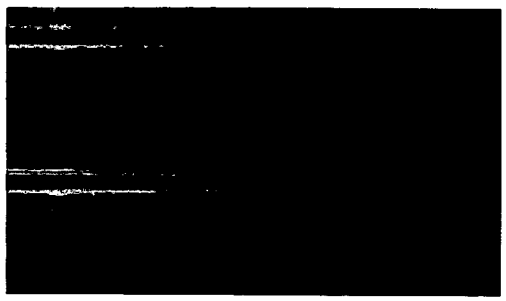
Figure 10F:
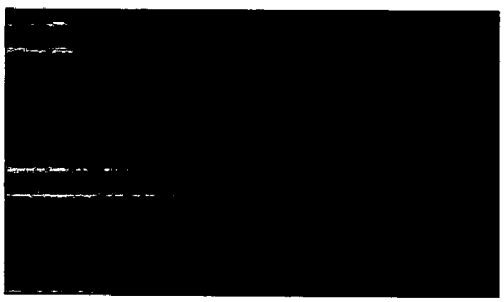
Figure 10G:
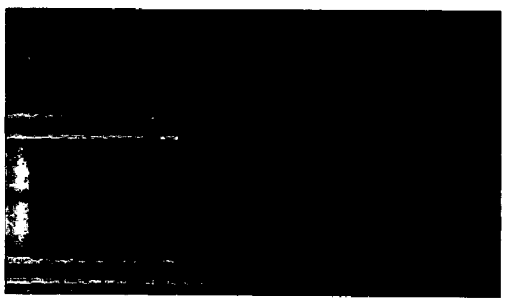
Figure 10H:
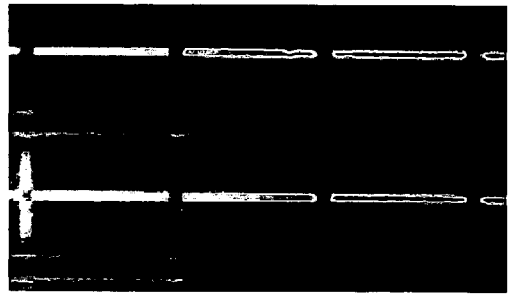

FIG. 10D shows the PL image of the uniform degradation of a metal canned device at end of life time (EOL). This degradation is due to the loss of efficiency of the light emitting polymer.

Figure 16B:
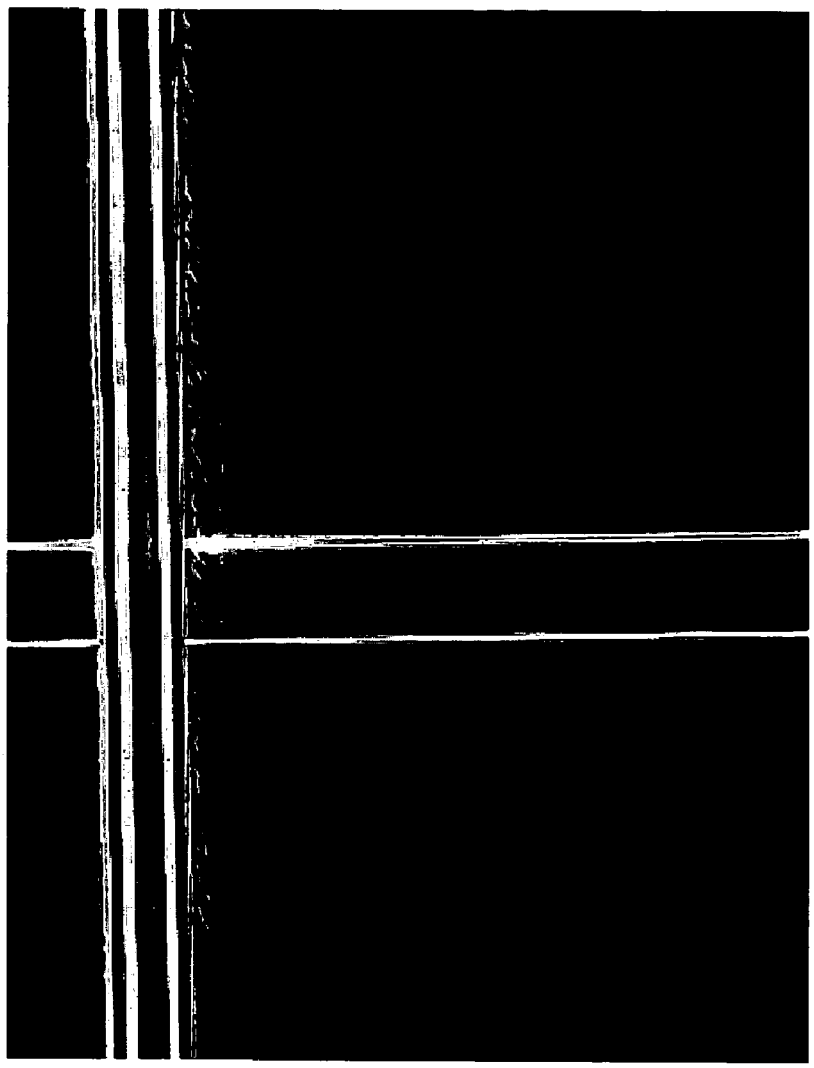
FIG. 16 are photographs showing mechanical damage to the device of FIG. 10F.
Figure 16A:
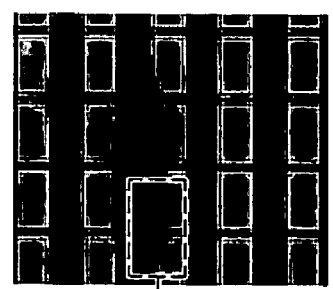

FIGS. 10E-10H show an unencapsulated device. The device was purposely exposed to the ambient atmosphere to produce chemical damage and was measured over a short time scale (FIG. 10E at t=0, FIG. 10F at t=5 min., and FIGS. 10G and 10H at t=10 min.). Looking at the widening with time of the brighter longitudinal bands at the edge of the Al cathode, it is possible to see the effect of a chemical deterioration of the contact area produced by the leaking atmosphere, in analogy to what is seen with the black spots on FIG. 10A-C. Comparing FIGS. 10B and 10F, it is also evident that the deterioration in the pixels coated with Formulation 1 is not of a pure chemical nature. Evidence of mechanical damage to the cathode was collected by microscope observations of the devices like the one shown as an example in FIGS. 16A and B. A line indicating bending/fracture of the cathode is visible defining the edge between light emitting and dark areas in the EL image of the pixels. Although other causes cannot be excluded, we think that this shows that the shrinkage of the polymer (which is significantly thicker near the cathode separators) is mechanically reducing the contact between the cathode and the OLED device thereby limiting the current that can flow in that area.

Figure 13:
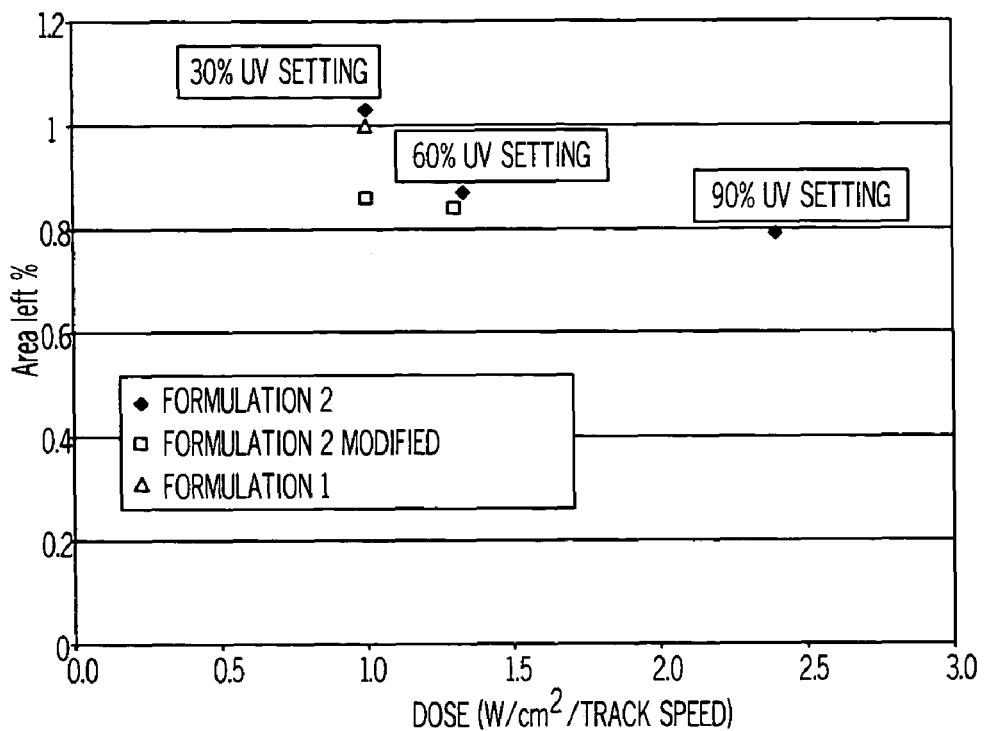
FIG. 13 is a graph showing starting pixel area after encapsulation for different formulations.

The polymer shrinkage and, as a consequence, the stress induced on the cathode of the OLED device, depend on cure conditions and polymer layer thickness, and they correlate with the bulk material properties of the formulation. This is shown in FIG. 13, where the area of the illuminated pixels for identical PM OLED devices is reported. The displays were encapsulated with the same multilayer structure (100 nm oxide/6 polymer/oxide pairs (0.5 µm polymer/40 nm oxide), and using the same UV conditions (30% UV setting (30 mW/cm², 30 cm/min track speed) (Fusion Systems 10 inch irradiator with an H-type bulb)) for curing the polymer layers. One set of displays was coated with Formulation 2, and another set was coated with a variation of Formulation 2 in which the trimethylolpropane triacrylate (TMPTA) was substituted with the same amount of the more reactive triethoxy trimethylolpropane triacrylate. The area of the illuminated pixel was reduced 15% immediately after encapsulation and prior to any aging testing (see data points at the equivalent dose of 1.0 mW/cm² track speed in FIG. 13 with respect to the value measured before coating).

The stress induced by the polymer shrinkage may be controlled by choosing appropriate curing conditions in order to reduce the conversion of the monomer units and therefore reduce shrinkage. This is shown in FIG. 13 for displays coated with Formulation 2. The normalized illuminated area of the pixels measured immediately after coating is close to 1 for curing condition 30% UV setting (30 mW/cm², 30 cm/min track speed), about 0.85 when cured at 60% UV setting (100 mW/cm², 75 cm/min track speed) and 0.8 when cured at 90% UV setting (200 mW/cm², 75 cm/min track speed). For all displays, the multilayer structure was 100 nm oxide/6 polymer/oxide pairs (0.5 µm polymer/40 nm oxide). If stress is controlled by reducing cure, consideration should be given to the adverse effect of increasing moisture permeation. In the cases presented in FIG. 13, even at the lower UV dose, the conversion was enough to maintain barrier performance compatible with the testing protocol commonly required for telecommunication displays (500 hr at 60° C. and 90% RH).

Figure 14:
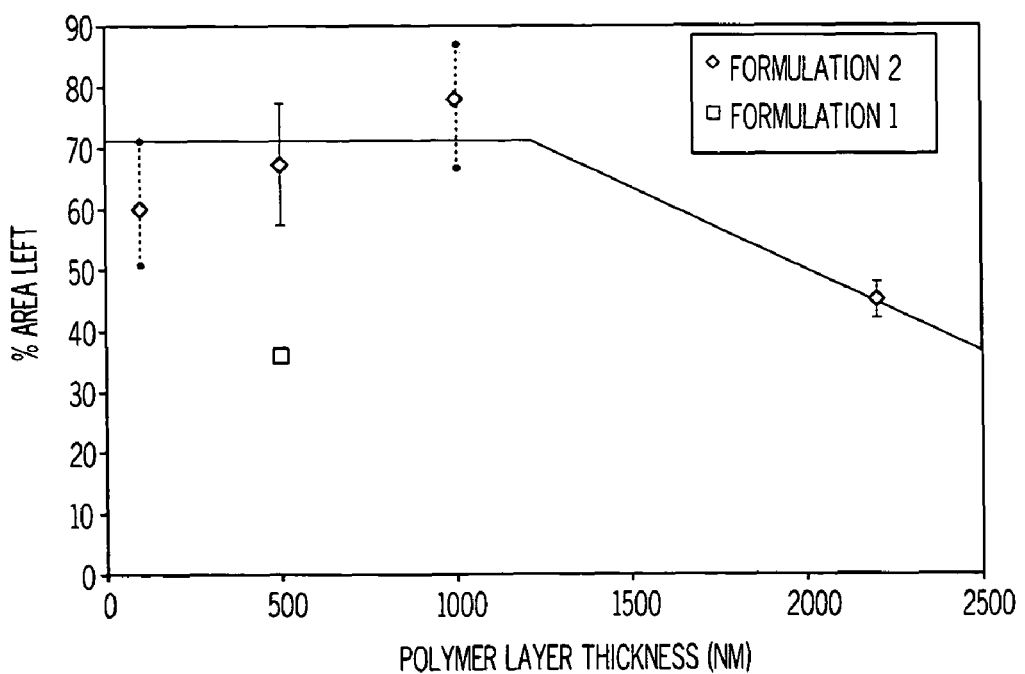
FIG. 14 is a graph showing the shrinkage of the polymer layer as a function of the thickness of the polymer layer for different formulations.

The stress induced by the monomer polymerization depends also on the thickness of the polymer layers used in the structure. This is shown in FIG. 14 where the shrinkage after aging 250 hr at 85° C. is shown as a function of the thickness of polymer used in the multilayer structure. For a display encapsulated with Formulation 2 (bulk shrinkage of 13.8) and polymer layers with thickness less than 1 µm, the illuminated area left is about 70% of the initial value. It decreases to 40% when the polymer thickness increases to 2.2 µm per layer (only 4 polymer layers in the multilayer structure were used in this case). For comparison, the area left for displays coated with Formulation 1 (bulk shrinkage of 16.0) (all other variables remaining constant) is also shown. In this case, the illuminated area is only 35% for polymer layers 0.5 µm thick.

The stress induced by the polymer layers used in multilayer encapsulation to the OLED devices should not increase due to later process steps involving higher temperature or during aging upon accelerated testing conditions or operation. High temperature is defined in this context as 80° C.<T<100° C., conditions compatible with the materials used in the fabrication of OLED devices. For example, stress may build up at higher temperature if the Tg of the formulation used in multilayer encapsulation is lower than 85° C., a typical temperature used for accelerated lifetime testing. At temperatures higher or close to the Tg, further conversion reaction may occur due to increased chain mobility for formulations which are not completely cured. As a consequence, the induced stress increases, and therefore the illuminated area may decrease.

FIGS. 11A and 11B show formulation 1 after coating. The non-uniform light distribution is visible. FIG. 11B shows substantial shrinkage after aging 100 hr at 85° C. in nitrogen. FIGS. 11C and 11D show formulation 2 after coating. FIG. 11D shows that formulation 2 has significantly reduced shrinkage after aging 100 hr at 85° C. compared to formulation 1. Because the samples were aged in nitrogen, the shrinkage is not due to moisture. The large difference in shrinkage is due to continued reaction of the polymer. When formulation 1 is aged at 85° C., it is closer to the $T_g$ (62° C.) of the polymer. The polymer continues to crosslink, and as a result shrinks more. With formulation 2 (Tg of 107° C.), some reaction occurs, but it is about one half as much as with formulation 1.

The polymer layer can be deposited using a variety of approaches including vacuum processes and atmospheric processes. Vacuum based approaches offer an advantage in that the processes are run in an environment essentially free of moisture, oxygen and other environmental contaminants, and are conveniently combined with vacuum based approaches for OLED deposition used for similar reasons. Atmospheric processes involve deposition at atmospheric pressures, but they can employ non-reactive, anhydrous gas (or mixed gases), rather than an ambient atmosphere.

Vacuum based approaches are disclosed by U.S. Pat. Nos. 4,842,893, 4,954,371, and 5,032,461, and they are particularly suited for the application of acrylate functional precursor blends. This approach utilizes a precursor deposition station (to supply the acrylate blend) combined with a curing station downstream to cure the deposited blend, and a central process drum that enables thermal control (chilling) of the substrate upon which the deposited blend condenses. The deposition station and curing unit are placed adjacent to a station configured to deposit an inorganic layer, such as a metal, an oxide, a nitride, or any of a wide range of other inorganic compounds. The inorganic layer can be deposited using thermal evaporation, sputtering, or another suitable process. The process allows for deposition and cure of the acrylate blend prior to deposition of an overlying inorganic layer, or deposition of an inorganic layer followed by deposition and cure of an acrylate layer. Multiple precursor deposition and curing station pairs and inorganic deposition stations can be used to enable single pass, multilayer stacks. As taught, the approach is well suited for depositing acrylate functional blends onto web substrates (substrates supplied in roll form) in a vacuum environment. While the approach has developed in detail for acrylate functional precursor blends cured by UV or EB exposure, it is applicable to other chemistries. U.S. Pat. No. 6,498,595 describes a cationic polymerization approach and uses reactive groups in addition to acrylates as precursors.

There are approaches using a similar configuration and central process drum that do not require a curing station immediately downstream from the precursor deposition station. One group of approaches is based on plasma polymerization of the precursor blend, a process that exposes a precursor blend to a plasma simultaneously with deposition, the exposure rendering the blend highly reactive and therefore polymerizing as it deposits. U.S. Pat. Nos. 5,902,641 and 6,224,948 teach plasma polymerization of flash evaporated precursor blends. U.S. Pat. No. 4,301,765 discloses an apparatus configured for plasma polymerization that does not rely on flash evaporation of the precursor blend, and further provides for a masking means to enable control of where deposition occurs. All three result in deposition and cure of the precursor blend, which can be important for enabling subsequent deposition (inline deposition) of an overlying inorganic layer, for contact with a transport roll, or for protecting an underlying layer or layers when the layer in question (after polymerization) will be the final, topmost layer of a multilayer stack applied to a web substrate. Another approach is disclosed by U.S. Pat. No. 6,506,461 which teaches flash evaporation and polymerization of precursors blends containing isocyanate (multiple —NCO) and polyol functional (multiple —OH groups) groups to form urethanes, and further, combinations of isocyanate and acrylate functional groups to enable dual curing approaches.

Vacuum deposition onto substrates in the form of discrete sheets, particularly if these sheets are also rigid requires alternative approaches. U.S. application Ser. No. 10/412,133, entitled Apparatus for Depositing a Multilayer Coating on Discrete Sheets, filed Apr. 11, 2003, (VIT-0018 PA) and Ser. No. 11/112,880, entitled Apparatus for Depositing a Multilayer Coating on Discrete Sheets, filed Apr. 22, 2005, (VIT-0018 IA) disclose vacuum based approaches using linear and hybrid apparatus combining cluster and linear elements. An important feature of these processes is the replacement of a central process drum with a conveying means and/or robotic arms to transport and position sheet substrates. The absence of the central process drum and the process temperature control (thermal management) it enables becomes an important consideration.

Coating discrete sheets imposes conditions which do not exist for coating continuous webs. First, coating discrete sheets is a start/stop process requiring multiple starts and stops of the precursor feed to the coating chamber. It also requires conveying apparatus and often masking apparatus to limit the coating deposition to the areas in which a coating application is desired. As a result, the substrate to be coated cannot conveniently be placed in contact with a heat sink, or other thermal regulation equipment, as can be done with web coating by placing the web in contact with a temperature controlled process drum. Thus, condensation on discrete sheet substrates takes place at higher temperatures than on continuous webs, and continuing deposition of subsequent coatings results in a general rise in the substrate temperatures.

Coating discrete sheets rather than continuous webs resulted in the recognition of the importance of deposition efficiency. Deposition efficiency is a characterization of the rate of condensation of a blend of precursors (monomers) on a substrate under a given set of conditions, and how the condensation rate will vary in response to changes in conditions. Deposition efficiency is determined by the following formula:

$$\text{Deposition Efficiency} = \frac{\text{Polymer thickness}(\mu m) \times \text{track speed}(cm/min)}{\text{Monomer flow}(ml/min)}$$

The thickness of the polymer layer was measured (an n&k Analyzer 1512RT reflectometer available from n&k Technology, Inc. of Santa Clara Calif. was used, and the measurement was in angstroms). For each sample used in generating the efficiency curve as a function of temperature, the speed of the discrete sheet through the processing chamber and the monomer flow rate were measured, and the deposition efficiency was calculated at the measured substrate temperature.

The substrates were pre-heated by passing them over the UV curing source prior to monomer deposition. The substrate temperature was measured by a thermocouple attached to the deposition surface on the glass plate used as a substrate. The substrate temperature during deposition is taken to be the temperature at the bottom of the step in the profile as the thermocouple passed over the monomer slit.

The deposited polymer thickness varies most strongly with substrate temperature and monomer flux at the substrate surface. Increasing the substrate temperature decreases the deposited thickness. This is believed to be due the reduced sticking coefficient and the increased re-evaporation rate. Increasing the monomer flow to the evaporator increases the vapor pressure of the monomer at the surface which increases the flux impinging on the substrate.

Figure 12:
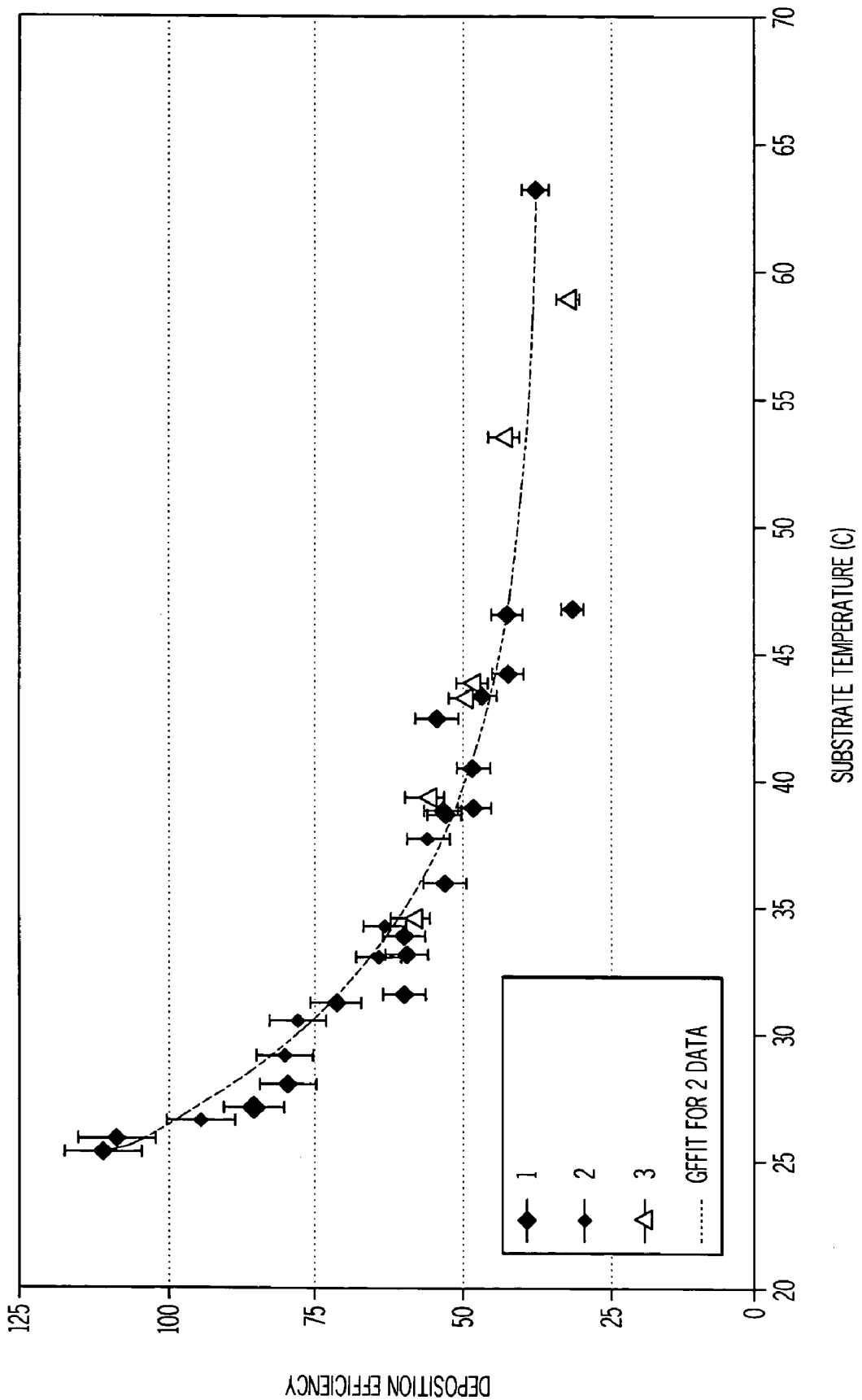
FIG. 12 is a graph of deposition efficiency v. substrate temperature.

Deposition efficiency was evaluated as a function of temperature for formulation 2 in Table 3 (deposited using three tools of similar, but not identical design), as shown in FIG. 12. The deposition efficiency was found to increase with a decrease in substrate temperature. Thus, one way to improve the deposition efficiency is to decrease the substrate temperature.

Deposition efficiency is important for processes involving condensation of a vapor, such as a vacuum flash evaporation process, onto discrete sheets. It becomes another consideration in selecting the precursor blend when the polymer layer is deposited using processes in which a vapor is condensed on discrete sheets.

The deposition efficiency of a precursor blend is in part dependent on the average molecular weight of the blend. The precursor blend should generally have an average molecular weight of at least about 275, or at least about 300, or about 275 to about 350, or about 275 to about 325. (As used herein, average molecular weight refers to weight average molecular weight.) Although blends can be used which have lower average molecular weights, polymeric decoupling layers made from such blends may have one or more undesirable characteristics.

The precursor blend can have a deposition efficiency of at least about 250, or at least about 275, or at least about 300, or at least about 325, or at least about 350, or at least about 375, or at least about 400. Deposition efficiency is a function of the molecular weights of the components of the blend, and to a lesser extent, structural considerations that impact volatility.

Selecting a precursor blend having a deposition efficiency of at least about 250 provides a polymeric decoupling layer having the stoichiometry of the starting precursor blend, and the precursor blend will condense to form liquid coatings via process conditions obtainable using available encapsulating apparatus.

It is possible to run at lower deposition efficiencies and obtain functional polymeric decoupling layers. However, the polymeric decoupling layers may have one or more undesirable characteristics. However, if other properties of the polymeric decoupling layer are particularly desirable, a decision can be made to use such blends. The compromise will be adjustment of the overall process parameters, such as speed, dwell time in coating stations, and cleaning requirements, to accommodate the less efficient blend.

By the appropriate selection of precursor blends, encapsulated environmentally sensitive devices having the necessary properties can be obtained.

EXAMPLE 4

Polymeric decoupling layers were made according to the formulations shown in Table 3. The deposition efficiency of the precursor blends was measured, and the average molecular weight was calculated.

TABLE 3

| Component | MW | Component Wt % | | | | |
|---|---|---|---|---|---|---|
| | | 1 | 2 | 3 | 4 | 5 |
| Methoxy Tripropyleneglycol Acrylate | 260 | | 3.5 | 3.4 | | |
| Lauryl Acrylate | 240 | 17.4 | | | 22.2 | |
| Hexanediol Diacrylate (HDODA) | 226 | | | | 62.2 | |
| Tripropyleneglycol Diacrylate (TPGDA) | 300 | | 69.6 | | | |
| Dodecanediol Dimethacrylate | 338 | 73.5 | | | | |
| Tricyclodecanedimethanol Diacrylate | 304 | | | 70.5 | | |
| Trimethylolpropane Triacrylate (TMPTA) | 294 | 8.0 | | | | |
| Triethoxy Trimethylolpropane Triacrylate | 428 | | | | 14.5 | 93.0 |
| Polyfunctional Adhesion Promoter | 336 (avg) | | 19.8 | 19.0 | | |
| Photoinitiator 1 | 208 | 1.1 | | | 1.1 | |
| Photoinitiator 2 | 217 | | 7.1 | 7.1 | | 7.0 |
| Example Molecular Weight (avg) | | 316 | 300 | 302 | 258 | 413 |
| Deposition Efficiency | | 370 | 209 | 232 | 128 | |

Formulation 1, which had an average molecular weight of 316 and a deposition efficiency of 370, showed low shrinkage and resistance to plasma damage. TMPTA is a desirable trifunctional acrylate based on its hydrocarbon backbone, but it is a small molecule known for shrinkage during cure. Therefore, it should be used at a low level.

Formulation 2, which had an average molecular weight of 300 and a deposition efficiency of 209, which can be used satisfactorily in thin film applications, showed undesirable shrinkage and plasma damage when used for encapsulation (at least with some types of OLEDs). This shows the desirability of avoiding polar backbone precursors and having higher Mw.

Formulation 3 shows the use of a polycyclic hydrocarbon backbone diacrylate in place of TPGDA, compounds which have similar molecular weights. The precursor blend had a similar deposition efficiency (232 v. 209). This formulation shows that cyclic or polycyclic hydrocarbon backbone precursors can be used in place of polar backbone precursors to provide blends with similar deposition efficiencies when the resultant average molecular weights are similar.

Formulation 4 is based on HDODA, a lower molecular weight hydrocarbon backbone diacrylate. The polymeric decoupling layer is resistant to plasma damage, but it has poor deposition efficiency corresponding to its lower average molecular weight. It also resulted in poor barrier performance. Triethoxy trimethylolpropane triacrylate was used to reduce shrinkage, but its use also results in the introduction of polar ethylene oxide units that increase water vapor permeability. This shows the desirability of avoiding polar backbone precursors.

Formulation 5 is based on triethoxy trimethylolpropane triacrylate, and has a deposition efficiency of 338 and an average molecular weight of 413. It is included to provide insight into the relationship between deposition efficiency and precursor blends with higher molecular weights. It is essentially a single monomer combined with a photoinitiator, so it is not an ideal comparison with the other formulations because it does not directly address the situation in which the high average molecular weight results from a blend of predominantly lower molecular weight precursors with a much higher molecular weight precursor. However, any differences are not believed to be significant.

One example of a suitable polymer precursor blend for encapsulation, which provides low shrinkage and adequate resistance to plasma damage, includes about 60 to about 90 wt % of a dimethacrylate, such as dodecanediol dimethacrylate, typically about 65 to about 75 wt %. It can include 0 to about 20 wt % of a monoacrylate, such as lauryl acrylate, typically about 10 to about 20 wt %. It can include 0 to about 20 wt % of a triacrylate, such as trimethylolpropane triacrylate, typically about 5 to about 15 wt %. It can also include about 1 to about 10 wt % of a photoinitiator, typically about 1 to about 3 wt %. Suitable photoinitiators are known to those in the art, and include, but are not limited to, diethoxyacetophenone (DEAP) or Esacure TZT (Trimethylbenzophenone based photoinitiator), available from Sartomer.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of encapsulating an environmentally sensitive device comprising:
    providing a substrate;
    placing at least one environmentally sensitive device adjacent to the substrate; and
    depositing at least one barrier stack adjacent to the environmentally sensitive device, the at least one barrier stack comprising at least one barrier layer and at least one polymeric decoupling layer, wherein the at least one polymeric decoupling layer is made from a polymer precursor blend comprising:
    about 60 to about 90 wt % of a dimethacrylate;
    0 to about 20 wt % of a monoacrylate;
    0 to about 20 wt % of a triacrylate; and
    about 1 to about 10% of a photoinitiator.

2. The method of claim 1 wherein the polymeric decoupling layer has no more than about $8 \times 10^{20}$ n/ml of ether linkages.

3. The method of claim 1 wherein the polymer precursor blend has an average molecular weight of at least about 275.

4. The method of claim 1 wherein at least one polymer precursor has a functionalized hydrocarbon backbone.

5. The method of claim 4 wherein the backbone is saturated.

6. The method of claim 4 wherein the backbone is unsaturated.

7. The method of claim 1 wherein the polymeric decoupling layer has no more than about $4.0 \times 10^{21}$ n/ml side chains.

8. The method of claim 1 wherein at least one polymer precursor has a functionalized hydrocarbon backbone, and wherein the polymeric decoupling layer has no more than about $8 \times 10^{20}$ n/ml of ether linkages.

9. The method of claim 8 wherein the hydrocarbon backbone is saturated.

10. The method of claim 8 wherein the hydrocarbon backbone is unsaturated.

11. The method of claim 8 wherein the polymeric decoupling layer has no more than about $4.0 \times 10^{21}$ n/ml side chains.

12. The method of claim 8 wherein the polymer blend has an average molecular weight of at least about 275.

13. The method of claim 1 wherein the dimethacrylate is present in an amount of about 65 to about 75 wt %.

14. The method of claim 1 wherein the monoacrylate is present in an amount of about 10 to about 20 wt %.

15. The method of claim 1 wherein the triacrylate is present in an amount of about 5 to about 15 wt %.

16. The method of claim 1 wherein the photoinitiator is present in an amount of about 1 to about 3 wt %.

17. The method of claim 1 wherein the at least one polymer precursor comprises:
    about 65 to about 75 wt % dodecane dimethacrylate;
    about 10 to about 20 wt % lauryl acrylate;
    about 5 to about 15 wt % trimethylolpropane triacrylate;
    about 1 to about 3 wt % of a photoinitiator.

18. A method of encapsulating an environmentally sensitive device comprising:
    providing a substrate;
    placing at least one environmentally sensitive device adjacent to the substrate; and
    depositing at least one barrier stack adjacent to the environmentally sensitive device, the at least one barrier stack comprising at least one barrier layer and at least one polymeric decoupling layer, wherein the at least one polymeric decoupling layer is made from a polymer precursor blend comprising:
    about 60 to about 90 wt % of a dimethacrylate;
    0 to about 20 wt % of a monoacrylate;
    0 to about 20 wt % of a triacrylate; and
    about 1 to about 10% of a photoinitiator;
    and wherein the polymeric decoupling layer has no more than about $8 \times 10^{20}$ n/ml of ether linkages and no more than about $4.0 \times 10^{21}$ n/ml side chains.

* * * * *